United States Patent [19]
Nemoto et al.

[11] Patent Number: 6,025,213
[45] Date of Patent: Feb. 15, 2000

[54] SEMICONDUCTOR LIGHT-EMITTING DEVICE PACKAGE AND METHOD OF MANUFACTURING THE SAME

[75] Inventors: Kazuhiko Nemoto; Osamu Matsuda; Toshimasa Kobayashi; Masato Doi, all of Kanagawa, Japan

[73] Assignee: Sony Corporation, Tokyo, Japan

[21] Appl. No.: 08/856,529

[22] Filed: May 14, 1997

Related U.S. Application Data

[62] Division of application No. 08/577,263, Dec. 22, 1995.

[30] Foreign Application Priority Data

Dec. 29, 1994 [JP] Japan .................. P06-340157

[51] Int. Cl.⁷ ............. H01L 21/44; H01L 21/48; H01L 21/50
[52] U.S. Cl. ............. 438/122; 438/106; 438/121
[58] Field of Search ............. 438/122, 121, 438/106

[56] References Cited

U.S. PATENT DOCUMENTS

| | | |
|---|---|---|
| 5,003,357 | 3/1991 | Kim et al. . |
| 5,296,724 | 3/1994 | Ogata et al. . |
| 5,352,852 | 10/1994 | Chun . |
| 5,376,580 | 12/1994 | Kish et al. . |
| 5,498,883 | 3/1996 | Lebby et al. . |
| 5,606,181 | 2/1997 | Sakuma et al. . |
| 5,869,891 | 2/1999 | Rostoker et al. ............. 438/122 |

*Primary Examiner*—Kevin M. Picardiàt
*Assistant Examiner*—D. Mary Collins
*Attorney, Agent, or Firm*—Hill & Simpson

[57] ABSTRACT

A surface-emission semiconductor light-emitting device package can radiate heat from the front surface while emitting light to the front surface of the device. The package includes a semiconductor light-emitting device for emitting light to a semiconductor substrate in the upper direction and a package window portion formed of a transparent heat sink, wherein the semiconductor light-emitting device is bonded to the package window portion in accordance with an interconnection pattern. A method of manufacturing semiconductor light-emitting device package also is described.

6 Claims, 24 Drawing Sheets

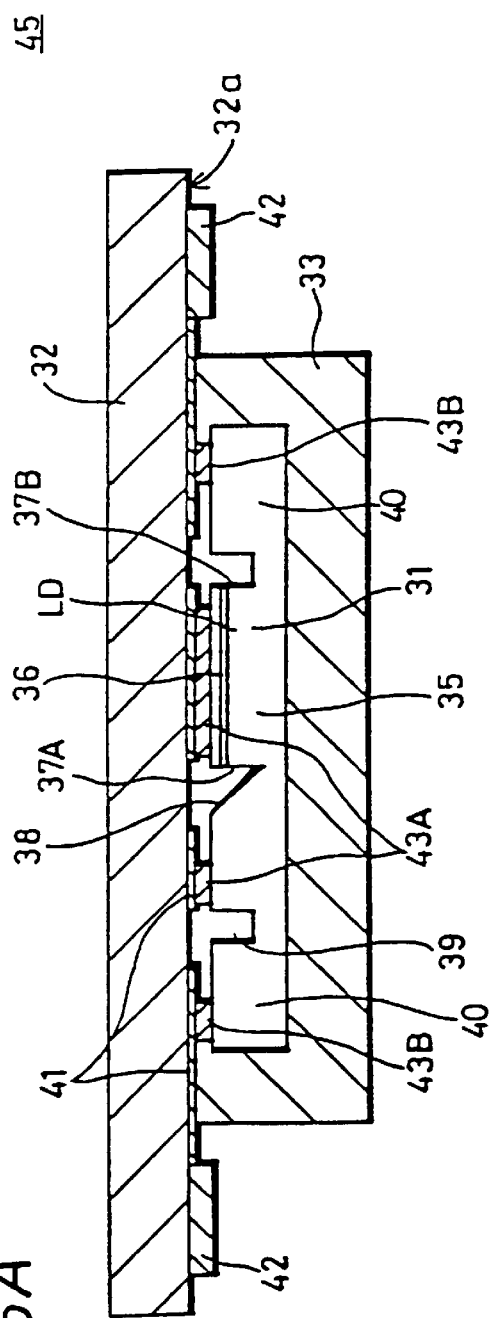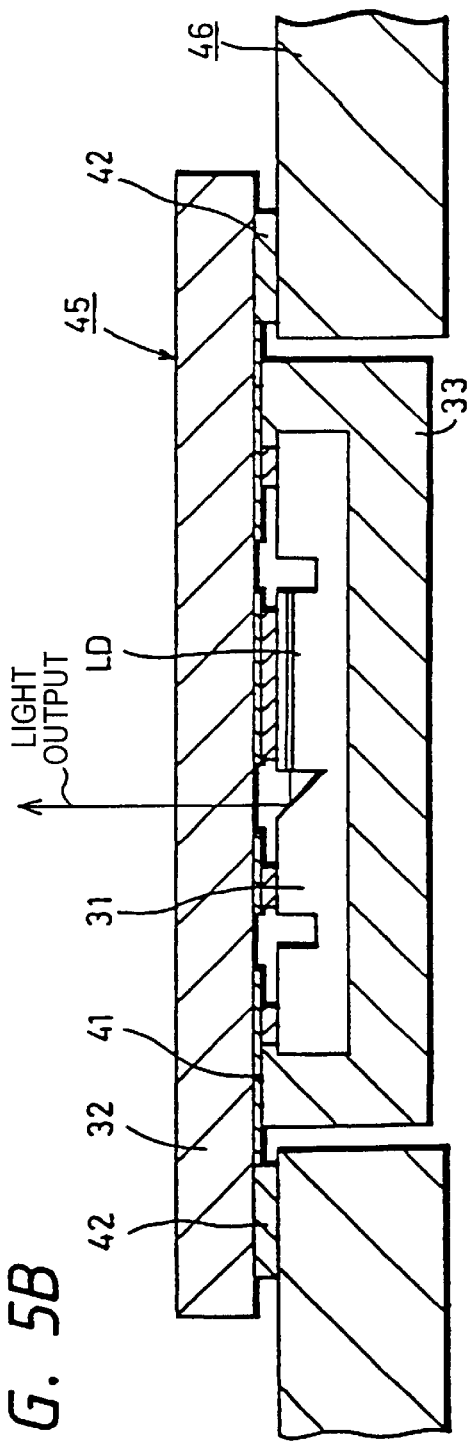
FIG. 5A
FIG. 5B

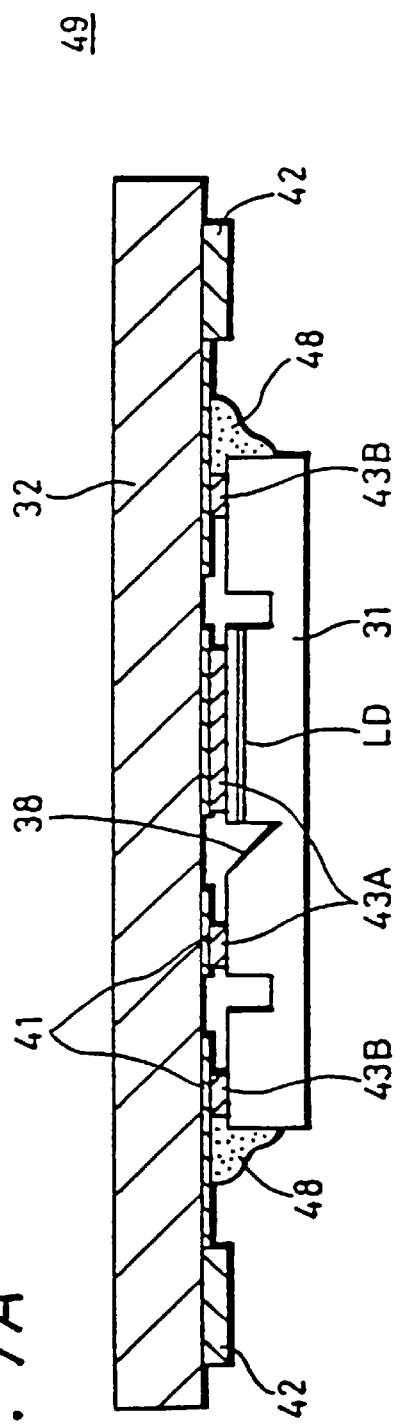
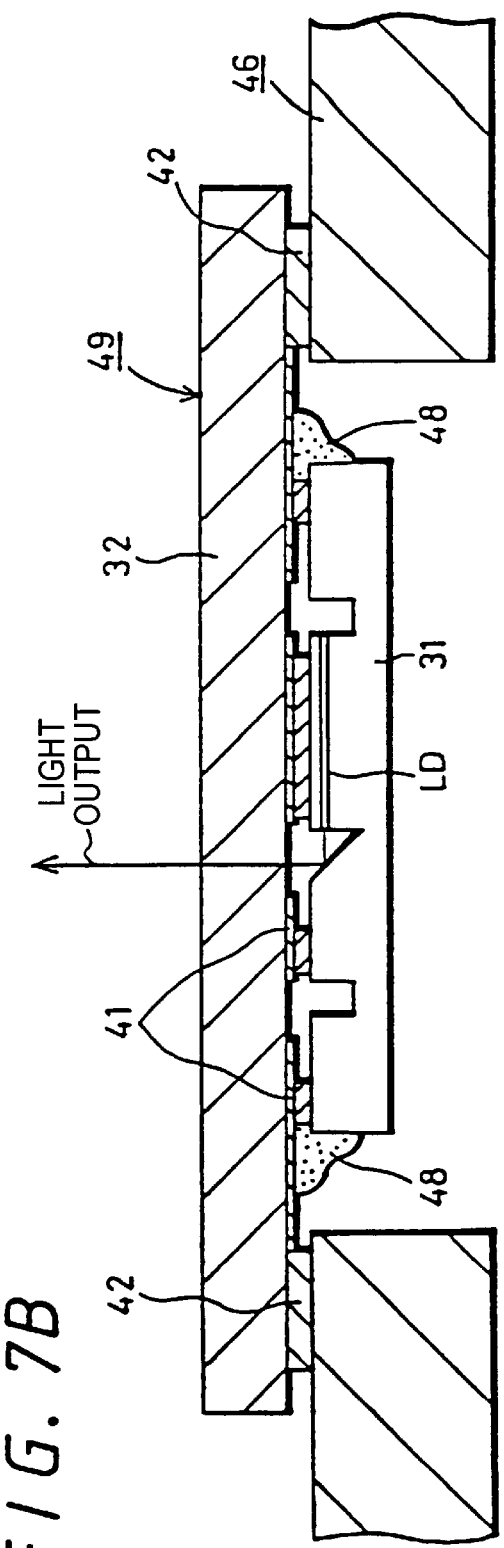
FIG. 7A
FIG. 7B

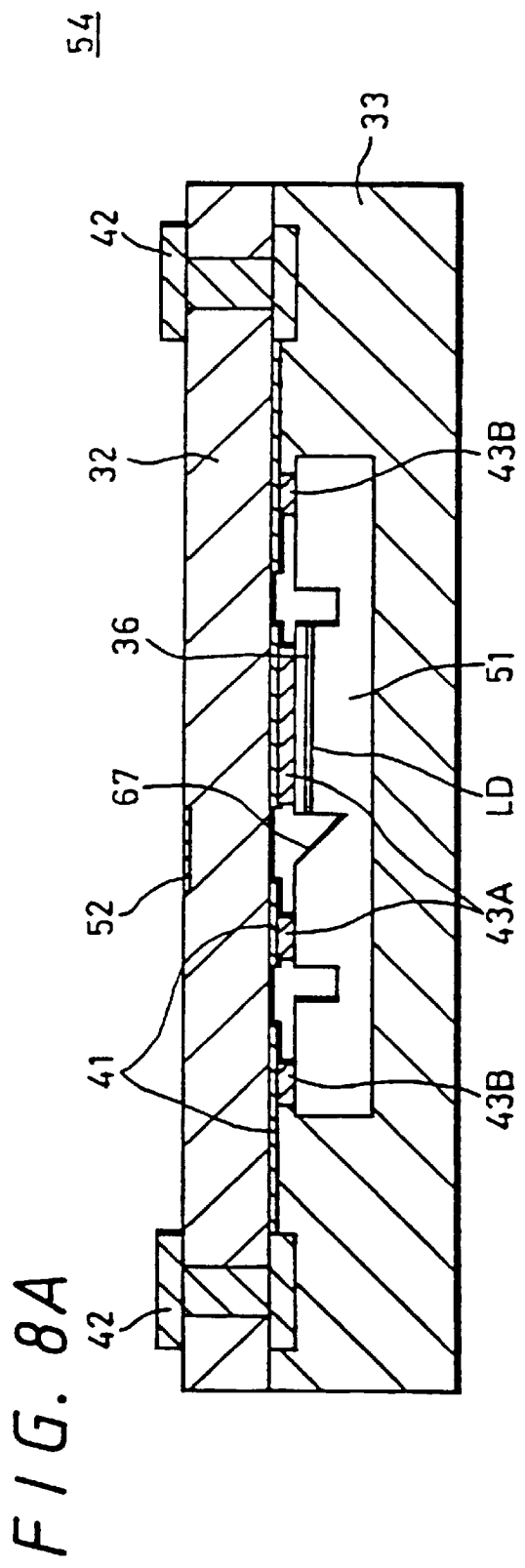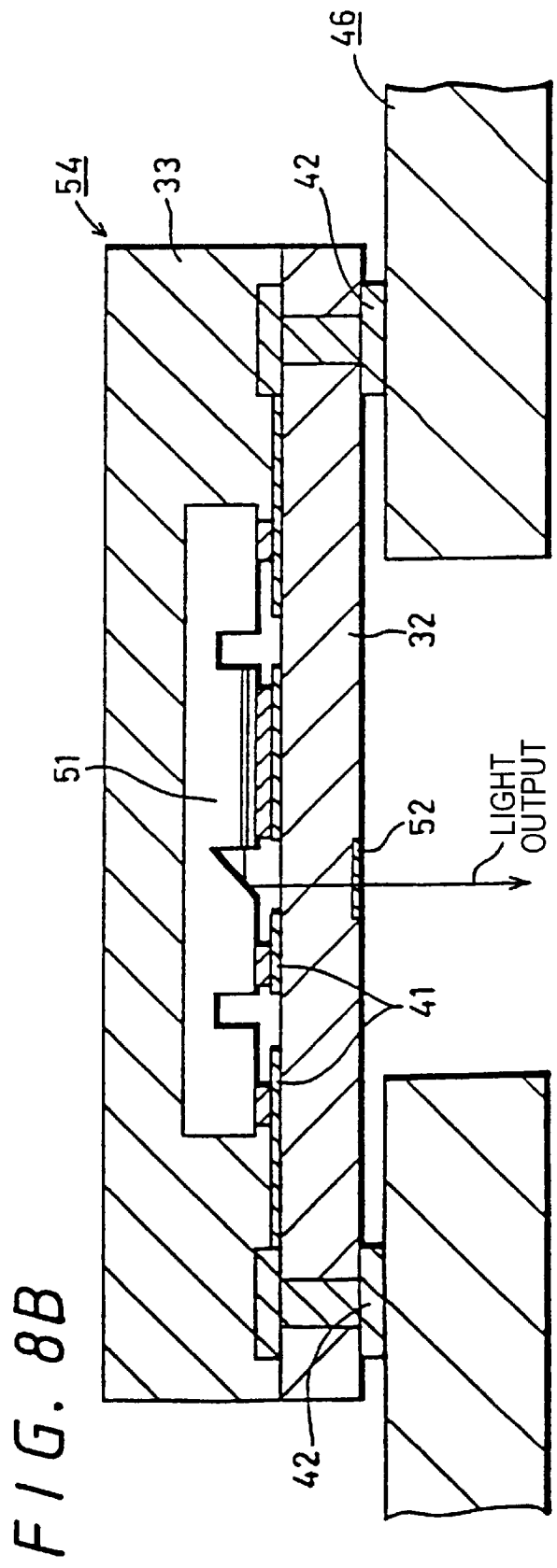

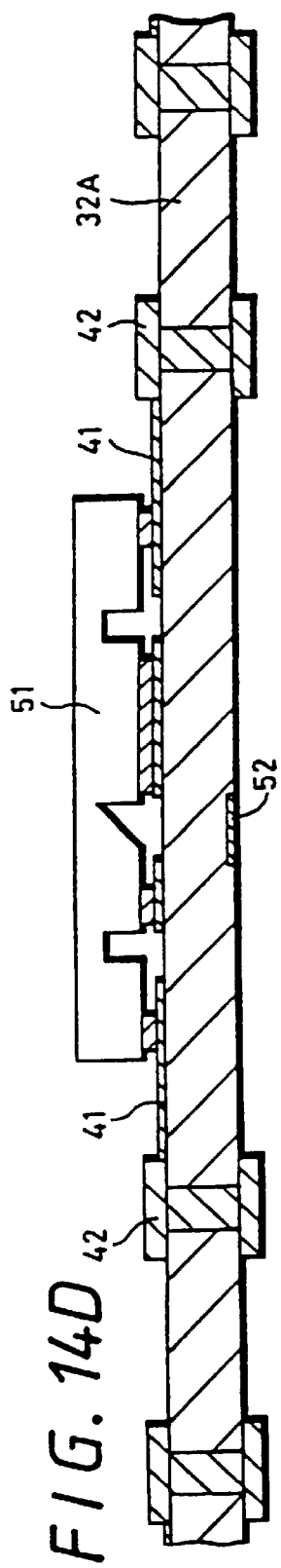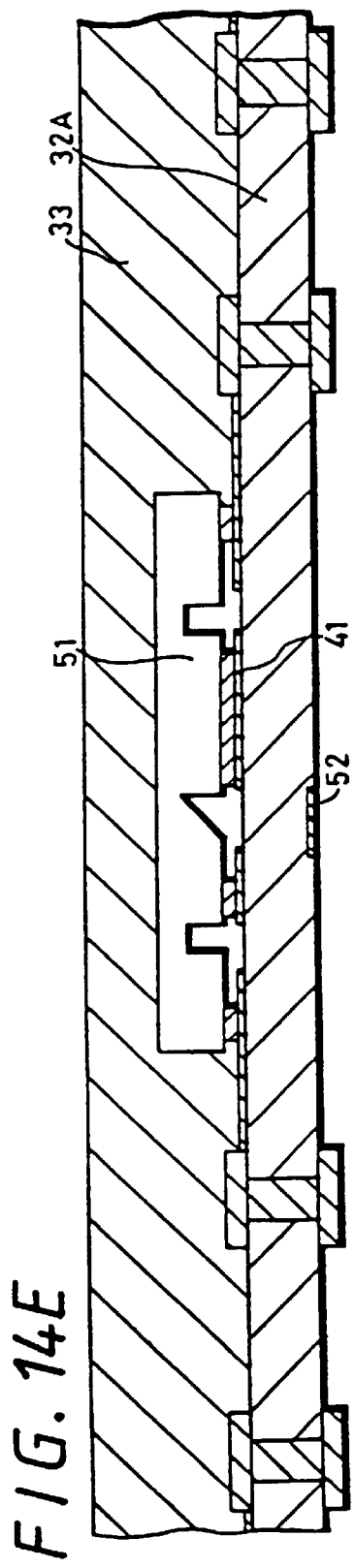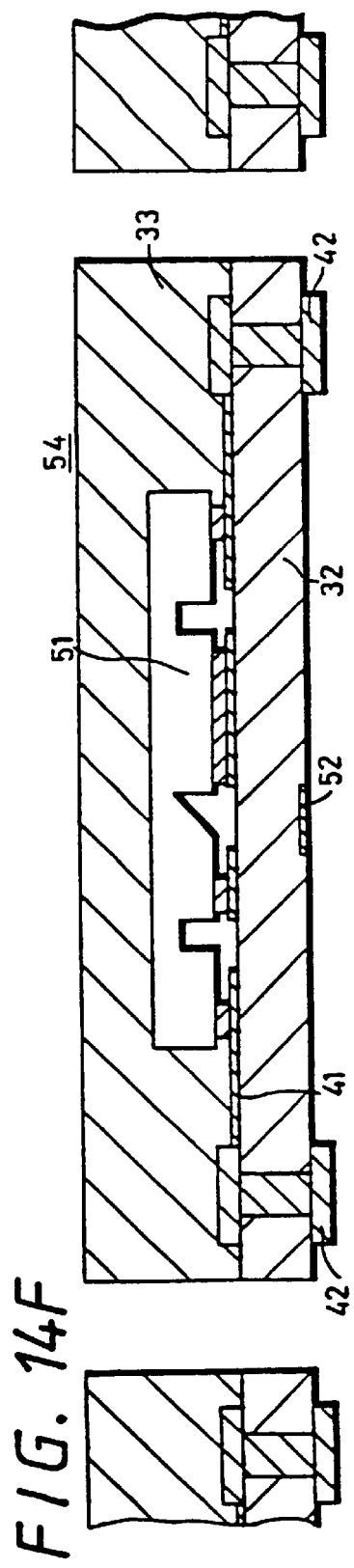

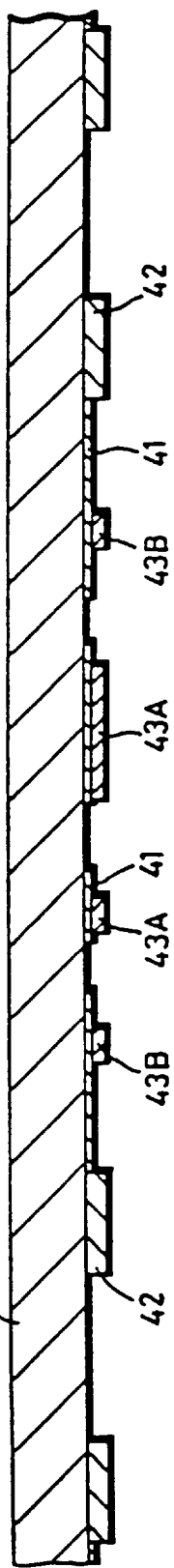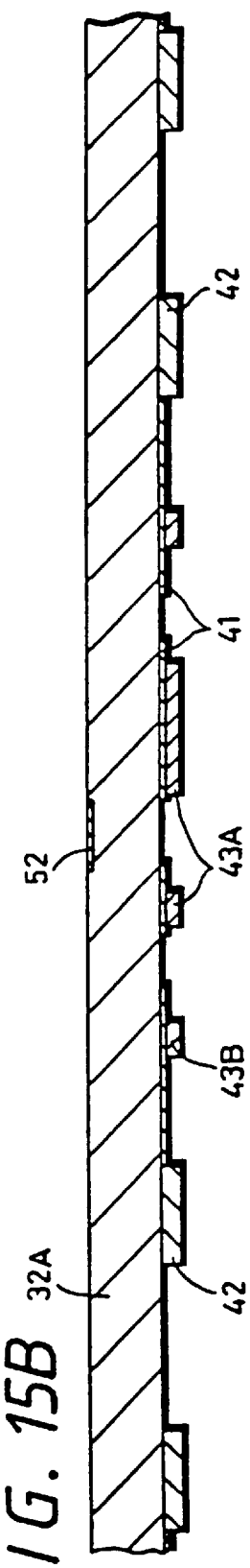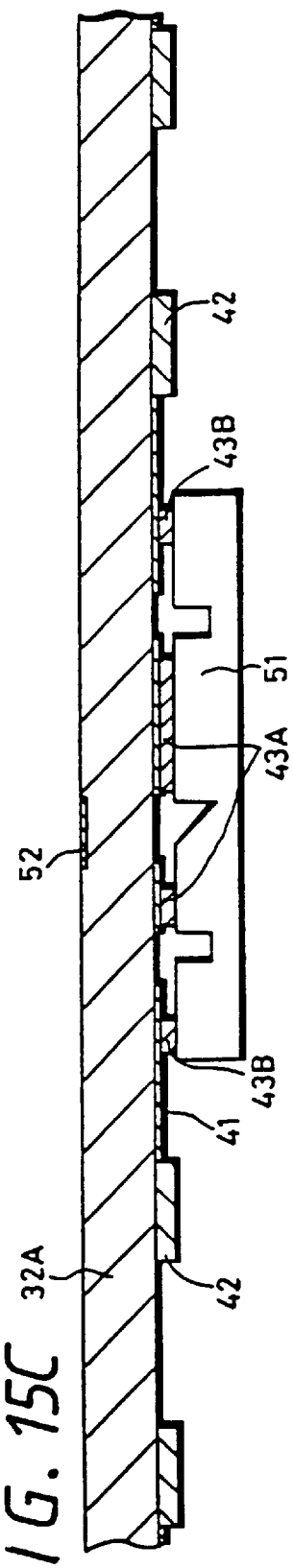

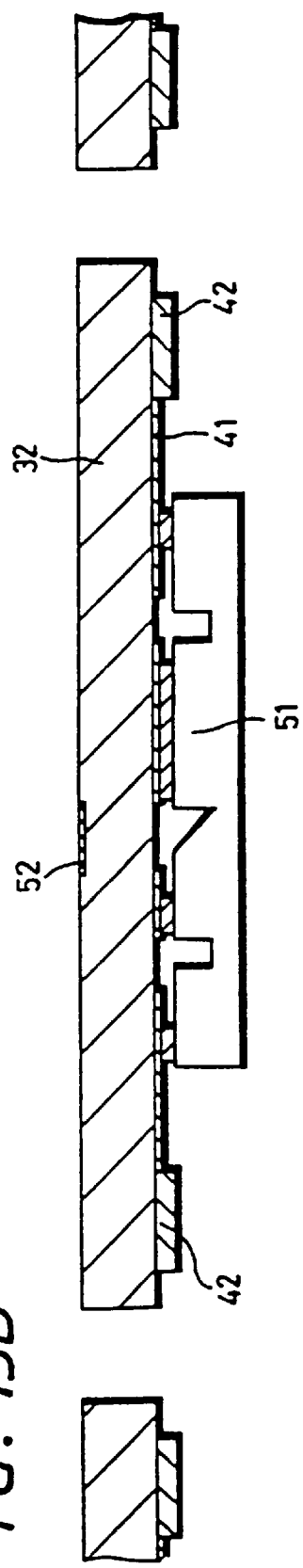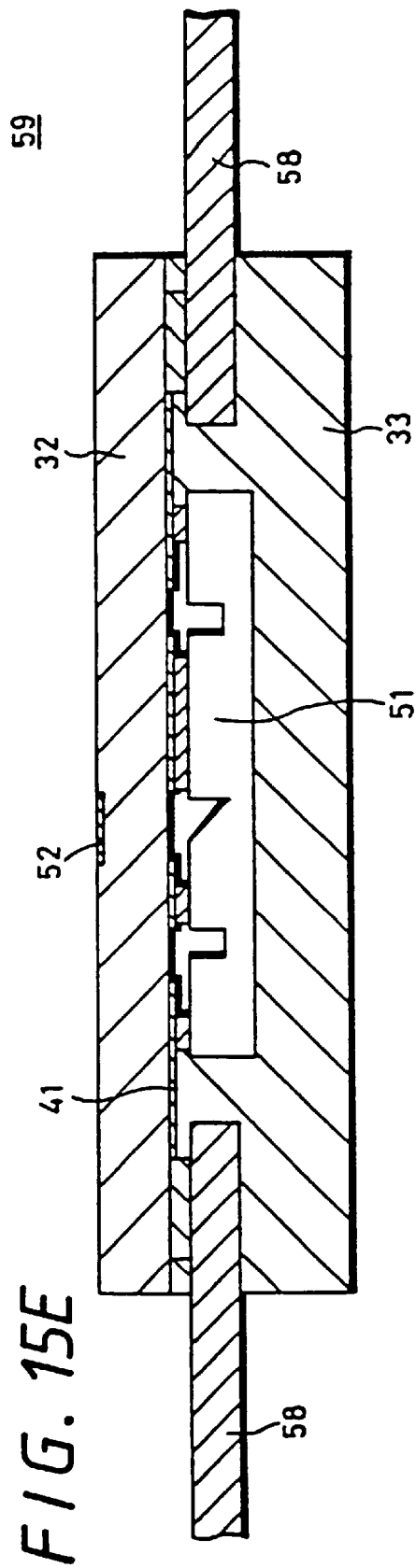

SEMICONDUCTOR LIGHT-EMITTING DEVICE PACKAGE AND METHOD OF MANUFACTURING THE SAME

This is a division, of application Ser. No. 08/577,263 filed Dec. 22, 1995.

BACKGROUND OF THE INVENTION

The present invention relates to a semiconductor light-emitting device package and a method of manufacturing a semiconductor light-emitting device the package.

Semiconductor light-emitting device packages use a bottom portion of package or submount substrate as a heat sink and a package cap or window made of a transparent material to pass light therethrough. Specifically, in the above method, the heat sink and the window from which light is passed are formed independently.

FIGS. 1 and 2 of the accompanying drawings show, in cross-sectional form, examples of a package structure on which a semiconductor light-emitting device is mounted.

As shown in FIG. 1, a semiconductor light-emitting device package 8 comprises a substrate 1, a heat sink 2 mounted on the substrate 1, a laser diode 3 attached to the side surface of the heat sink 2, a cap attached to the substrate 1 for capping the laser diode 3 and the heat sink 2 and a transparent window 5 formed on the cap 4 to irradiate light L emitted from the laser diode 3. Reference numerals 6 denote terminal pins extended through the substrate 1. Reference numeral 7 denotes a metal thin interconnection for connecting an electrode of the laser diode 3 and the terminal pins 6.

A semiconductor light-emitting device package 10 shown in FIG. 2 is of the hybrid type. As shown in FIG. 2, the semiconductor light-emitting device package 10 comprises a package assembly 11, a semiconductor substrate 12 mounted on the bottom surface of the package assembly 11, a submount substrate 13 and a prism 14 mounted on the semiconductor substrate 12, a laser diode 15 attached to the submount substrate 13, and a transparent window 16 attached to the upper surface of the package assembly 11. In this semiconductor light-emitting device package 10, light L emitted from the laser diode 15 is reflected on the inclined surface of the prism 14 and is passed through the transparent window 16 to the outside. If the semiconductor light-emitting device package 10 is formed as an optical pickup, then reflected-back or returned light that has been reflected on a disk (not shown) is introduced into the prism 14 and received by a photodetector 17 formed on the surface of the semiconductor substrate 12 as shown by broken lines. In this case, the semiconductor substrate 12 and the submount substrate 13 act as a heat sink of the laser diode 15.

When the heat sink 2 and the side from which light L travels are formed on the different sides like the semiconductor light-emitting device 8 shown in FIG. 1, or the semiconductor light-emitting device package 10 is of the hybrid type as shown in FIG. 2, these packages 8 and 10 can be arranged by well-known methods.

FIG. 3 shows, in cross-sectional form, an example of a monolithic surface-emission light-emitting device wherein light is emitted on the surface of the device and a heat sink should be mounted on the same surface. As shown in FIG. 3, a laser diode 22 (reference numeral 22 generally represents an active layer) composed of a horizontal resonator is formed on a semiconductor substrate 21. A reflection surface 24 with an inclination of 45° is opposed to a resonator end face 23A of resonator end faces 23A, 23B. Light L output from the resonator end face 23A is reflected on the reflection surface 24 and is emitted in the vertical direction. It becomes difficult to attach a heat sink to the above surface-emission light-emitting device.

In this case, there are restrictions arising from a device structure standpoint or device operation standpoint, such as the laser diode 22 being formed as a particularly high-efficiency type, the laser diode 22 being operated by a relatively low power or in a pulse operation fashion.

To solve the above-mentioned problem, an interconnection 26 formed on the surface of the laser diode 22 is increased in thickness by a proper method such as plating and this thick film interconnection 26 can serve as a heat sink. However, it is no so easy to form a metal thick film on an uneven device. Moreover, according to this technique, a satisfactory heat sink effect cannot always be achieved, i.e., heat is difficult to be transmitted to the outside.

SUMMARY OF THE INVENTION

In view of the aforesaid aspect, it is an object of the present invention to provide a semiconductor light-emitting device package and a method of manufacturing a semiconductor light-emitting device package wherein the above problems that a monolithic surface-emission device requiring a heat sink provided on the front surface while emitting light on the front surface thereof has encountered can be solved.

A semiconductor light-emitting device package according to the present invention includes a semiconductor light-emitting device for emitting light in the upper direction of a substrate, a package window portion formed of a transparent heat sink and an interconnection pattern formed on a light-emitting device of the package window portion wherein the semiconductor light-emitting device is bonded to the package window portion in accordance with the interconnection pattern.

A method of manufacturing a semiconductor light-emitting device package comprises the steps of forming an interconnection pattern on a transparent heat sink, bonding a semiconductor light-emitting device for emitting light in the upper direction of a substrate to the interconnection pattern of the transparent heat sink and dividing the transparent heat sink to provide a plurality of packages by dicing, wherein the transparent heat sink is used as the package window portion.

Since the semiconductor light-emitting device package includes the semiconductor light-emitting device for emitting light in the upper direction of the substrate and the package window portion formed of the transparent heat sink wherein the semiconductor light-emitting device is bonded to the package window portion in accordance with the interconnection pattern of the package window portion, light can be emitted through the package window portion in the upper direction of the semiconductor light-emitting device. Concurrently therewith, the package window portion acts as the heat sink to radiate heat generated in the semiconductor light-emitting device.

Further, since the package window portion and the semiconductor light-emitting device are bonded to each other, the structure of the package can be simplified extremely. Furthermore, since the interconnection pattern is formed on the package window portion, complicated multilayer interconnection process can be simplified and the semiconductor light-emitting device package can be directly mounted on other assembly mount substrate (e.g., interconnection substrate), thereby making it possible to mount the semiconductor light-emitting device package with ease.

According to the method of manufacturing the semiconductor light-emitting device package of the present invention, since the interconnection pattern is formed on the transparent heat sink and a plurality of semiconductor light-emitting devices are sealed by the resin after the semiconductor light-emitting devices has bonded to the interconnection pattern side of the transparent heat sink, the semiconductor light-emitting device is completely hermetically sealed by the transparent heat sink and the resin.

Then, since the transparent heat sink is diced together with the resin to provide a plurality of packages and the transparent heat sink is used as the package window portion, it is possible to easily manufacture a desired semiconductor light-emitting device package in which the light-emitting device emits light in the upper direction and in which the package window portion is used as the heat sink.

BRIEF DESCRIPTION OF THE DRAWINGS

FIG. 5A is a cross-sectional view showing a semiconductor light-emitting device package according to a first embodiment of the present invention;

FIG. 5B is a cross-sectional view illustrative of a manner in which the semiconductor light-emitting device optical package according to the present invention is mounted on an assembly mount substrate;

FIG. 7A is a cross-sectional view showing a semiconductor light-emitting device package according to a third embodiment of the present invention;

FIG. 7B is a cross-sectional view showing a manner in which the semiconductor light-emitting device package according to the present invention is mounted on an assembly mount substrate;

FIG. 8A is a cross-sectional view illustrative of a semiconductor light-emitting device package according to a fourth embodiment of the present invention;

FIG. 8B is a cross-sectional view illustrative of a manner in which the semiconductor light-emitting device package is mounted on an assembly mount substrate;

FIGS. 14A through 14F are process diagrams showing a method of manufacturing a semiconductor light-emitting device package according to a fifth embodiment of the present invention;

FIGS. 15A through 15E are process diagrams showing a method of manufacturing a semiconductor light-emitting device package according to a sixth embodiment of the present invention;

DETAILED DESCRIPTION OF THE PREFERRED EMBODIMENTS

Figure 1:
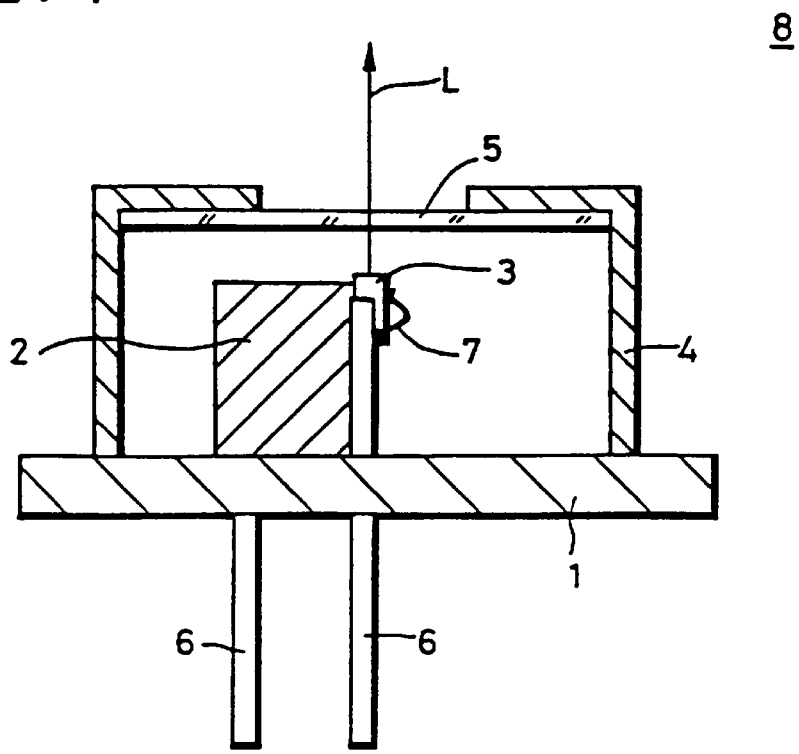
FIG. 1 is a cross-sectional view showing an example of a semiconductor light-emitting device package.
Figure 2:
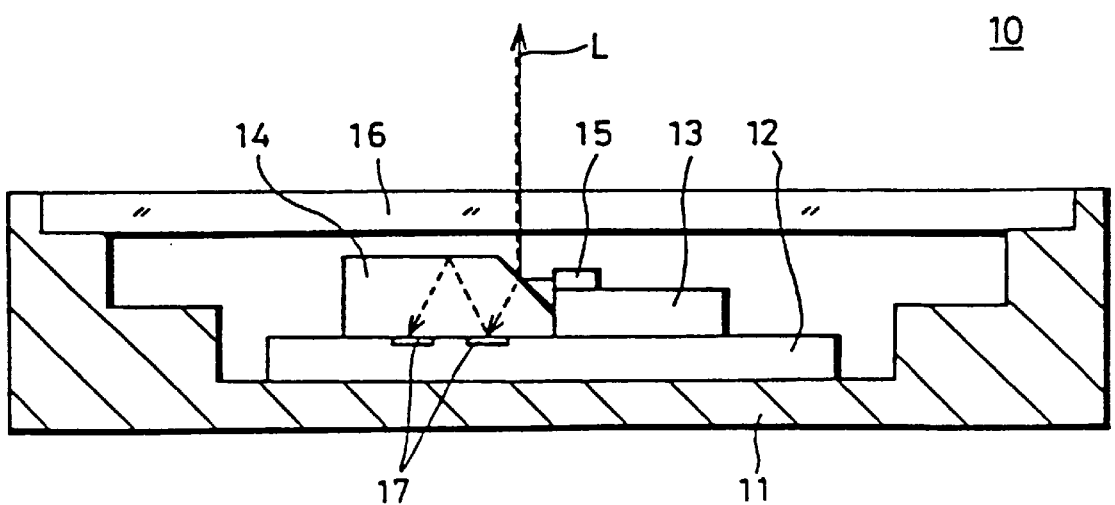
FIG. 2 is a cross-sectional view showing another example of a semiconductor light-emitting device package.
Figure 3:
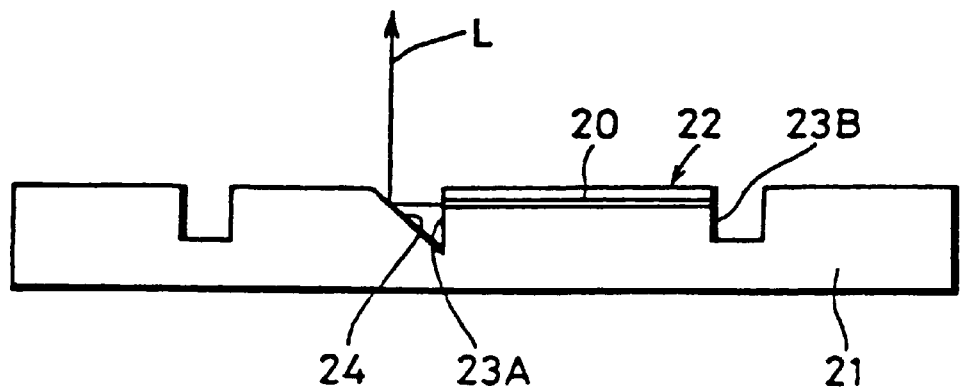
FIG. 3 is a cross-sectional view showing an example of a surface-emission semiconductor light-emitting device.

A semiconductor light-emitting device package and a method of manufacturing a semiconductor light-emitting device package according to the present invention will hereinafter be described with reference to the drawings.

FIG. 5A shows, in cross-sectional form, a semiconductor light-emitting device package according to an embodiment of the present invention. FIG. 5B shows, in cross-sectional form, a manner in which this semiconductor light-emitting device package is attached to an assembly mount substrate (e.g., interconnection substrate, etc.). In this embodiment, as illustrated, an optical package 45 generally comprises a semiconductor light-emitting device 31, a package window portion 32 composed of a heat sink made of a transparent material (material having a high transmittance) for passing a wavelength of light L emitted from the semiconductor light-emitting device 31 and a resin mold assembly 33 for sealing the semiconductor light-emitting device 31.

The semiconductor light-emitting device 31 is of the surface-emission type wherein a laser diode LD formed of a horizontal resonator formed on one surface of a semiconductor substrate 35 (reference numeral 36 generally represents an active layer), a reflection surface 38 with an inclination of 45° is opposed to one resonator end face 37A of resonator end faces 37A, 37B and light emitted from the resonator end face 37A is reflected on the reflection surface 38 and emitted in the vertical direction. A separating groove 39 is formed on the resin mold assembly 33 so as to surround the area including the laser diode LD and a reflection mirror. An outer peripheral portion 40 of the separating groove 39 is used as a sealing region.

The package window portion 32 composed of the transparent heat sink is transparent to a wavelength of light emitted from the laser diode LD. If a semiconductor light-emitting device needs light input from the outside, then the package window portion 32 should be made transparent for a wavelength of such introduced light. Sapphire, ruby, beryllia, diamond, Si, $SiO_2$ or the like are available as a material for making the package window portion 32 composed of the transparent heat sink. Of the above materials, the most suitable material is selected considering characteristics of semiconductor light-emitting device, effect of heat sink and cost of optical package.

The package window portion 32 is made of a parallel flat surface plate of which the area is larger than that of the resin mold assembly 33. An interconnection pattern 41 is formed on the package window portion 32 at its one surface, i.e., a surface 32a on which the semiconductor light-emitting device 31 is mounted. The package window portion 32 has a signal deriving electrode pad portion 42 connected to the interconnection pattern 41 at its portion outwardly extended to be longer than the resin mold assembly 33. The interconnection pattern 41 might be formed of ordinary interconnection material, such as Al, Au or transparent interconnection material of ITO.

The semiconductor light-emitting device 31 is bonded to solder layers 43 (43A, 43B) such that the upper surface for the exit end for emitting light L is opposed to the interconnection pattern 41 of the package window portion 32. Reference numeral 43A denotes an interconnection solder and 43B a sealing solder provided on the sealing area.

Under the condition that the semiconductor light-emitting device 31 is mounted on the package window portion 32 formed of the transparent heat sink, the semiconductor light-emitting device 31 is covered with a resin from the back surface, thereby the resin mold assembly 33 being formed.

The semiconductor light-emitting device 31 is hermetically sealed by the package window portion 32 and the resin mold assembly 33 and thereby protected from the outside.

The semiconductor light-emitting device package 45 is mounted on an assembly mount substrate 46 through an electrode pad 42 as shown in FIG. 5B. According to the semiconductor light-emitting device package 45, since the package window portion 32 formed of the transparent heat sink is bonded to the semiconductor light-emitting device 31 at its surface side from which light L is emitted, light emitted from the semiconductor light-emitting device 31 can be emitted in the vertical direction. Also, since the semiconductor light-emitting device 31 is directly brought in contact with the package window portion 32, heat generated in the semiconductor light-emitting device 31 can be radiated satisfactorily.

Since the interconnection pattern 41 is formed on one surface of the package window portion 32, the interconnection can be formed on the semiconductor chip on which the semiconductor light-emitting device 31 is formed and the package window portion 32 separately, thereby complicated multi-layer interconnection process being simplified.

Furthermore, as compared with the conventional package structure, the optical package of the present invention can be simplified in structure, manufactured with ease and therefore can be made suitable for being mass-produced.

Figure 6:
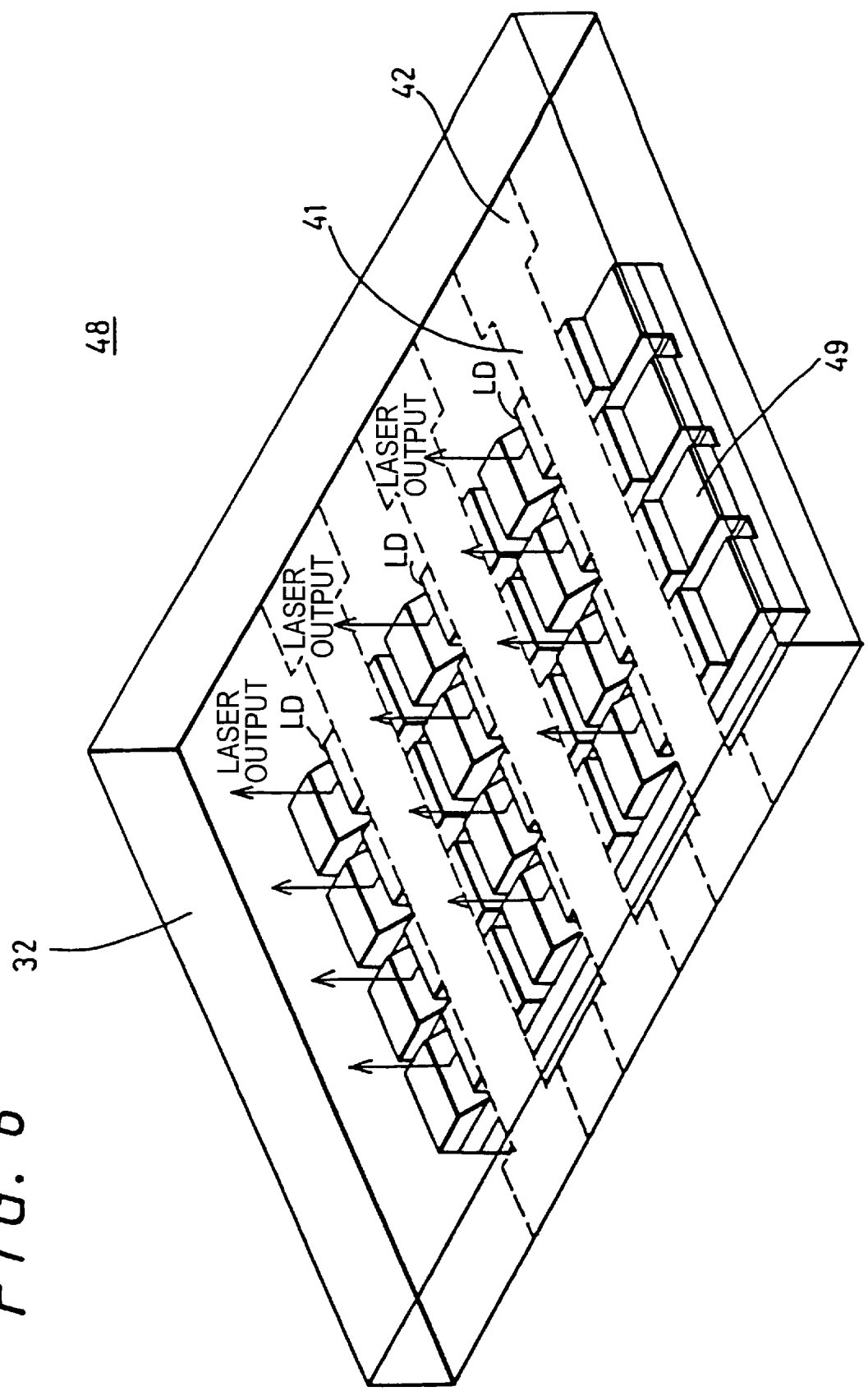
FIG. 6 is a perspective view illustrative of a main portion of a semiconductor light-emitting device package according to a second embodiment of the present invention wherein the optical package is applied to a surface-emission laser array.

FIG. 6 shows, in perspective form, a surface-emission laser array 48 wherein three 45°-reflection surface-emission lasers LD are arrayed. The surface-emission laser array 48 is composed of a lower interconnection layer 49 formed on the laser array side and other interconnection layer (interconnection pattern) 41 formed on the package window portion 32 formed of the transparent heat sink. The lower interconnection layer 49 can be formed of n-type GaAs layer, for example, formed on a semi-insulating GaAs substrate. A laser diode array can be formed on the n-type GaAs layer. When the present invention is applied to the surface-emission laser array 48, it is possible to simplify complicated multi-layer interconnection processes.

The present invention is not limited to the embodiment shown in FIGS. 5A and 5B and can be modified in various ways. By way of example, the semiconductor light-emitting device may be fixed by an adhesive instead of the resin mold. Alternatively, the semiconductor light-emitting device may be deposited on the whole surface of the package window portion by CVD (chemical vapor deposition).

If necessary, not only the interconnection pattern 41 but also an optical device such as a hologram, a grating, a lens, a reflector or a photodetector made of amorphous silicon or polycrystalline silicon can be integrated on the package window portion 32 serving also as the heat sink. Furthermore, element assemblies such as device circuits also can be integrated on the package window portion 32. Modified examples will be described below.

FIGS. 7A and 7B are cross-sectional views illustrating a semiconductor light-emitting device package according to a third embodiment of the present invention. A semiconductor light-emitting device package 49 shown in FIGS. 7A and 7B is different from the semiconductor light-emitting device package 45 shown in FIGS. 5A and 5B only in that a semiconductor light-emitting device 31 and a package window portion 32 formed of a transparent heat sink are fixed by a resin adhesive 48 instead of the resin mold assembly 33 in such a way as to surround the semiconductor light-emitting device 31. A rest of the arrangement is similar to that of the semiconductor light-emitting device package 45 shown in FIGS. 5A and 5B. Therefor, in FIGS. 7A and 7B, elements and parts identical to those of FIGS. 5A and 5B are marked with the same references and need not be described in detail.

In the semiconductor light-emitting device package 49 shown in FIGS. 7A and 7B, because the semiconductor light-emitting device 31 is fixed to the package window portion 32 by the resin adhesive, the structure of the semiconductor light-emitting device package 49 can be simplified and the semiconductor light-emitting device package 49 can be manufactured with ease.

Similarly to the semiconductor light-emitting device package 45 shown in FIGS. 5A and 5B, since the surface-emission light-emitting device 31 has the package window portion 32 formed of the transparent heat sink bonded to the front surface side from which light is emitted, a satisfactory heat sink effect for the semiconductor light-emitting device 31 can be achieved. Furthermore, complicated multilayer interconnection process can be simplified and the semiconductor light-emitting device package 49 can be mass-produced satisfactorily.

FIGS. 8A and 8B show, in cross-sectional form, a semiconductor light-emitting device package 54 according to a fourth embodiment of the present invention. In this embodiment, a light-coupled device 51 composed of a semiconductor laser LD and a photodiode PD serving as a light-receiving device, i.e., CLC (confocal laser coupler) device is applied the semiconductor light-emitting device package 54 as a semiconductor light-emitting device.

The light-coupled device 51 of the CLC device will be described with reference to FIGS. 9A, 9B and FIGS. 10 and 11.

Figure 10:
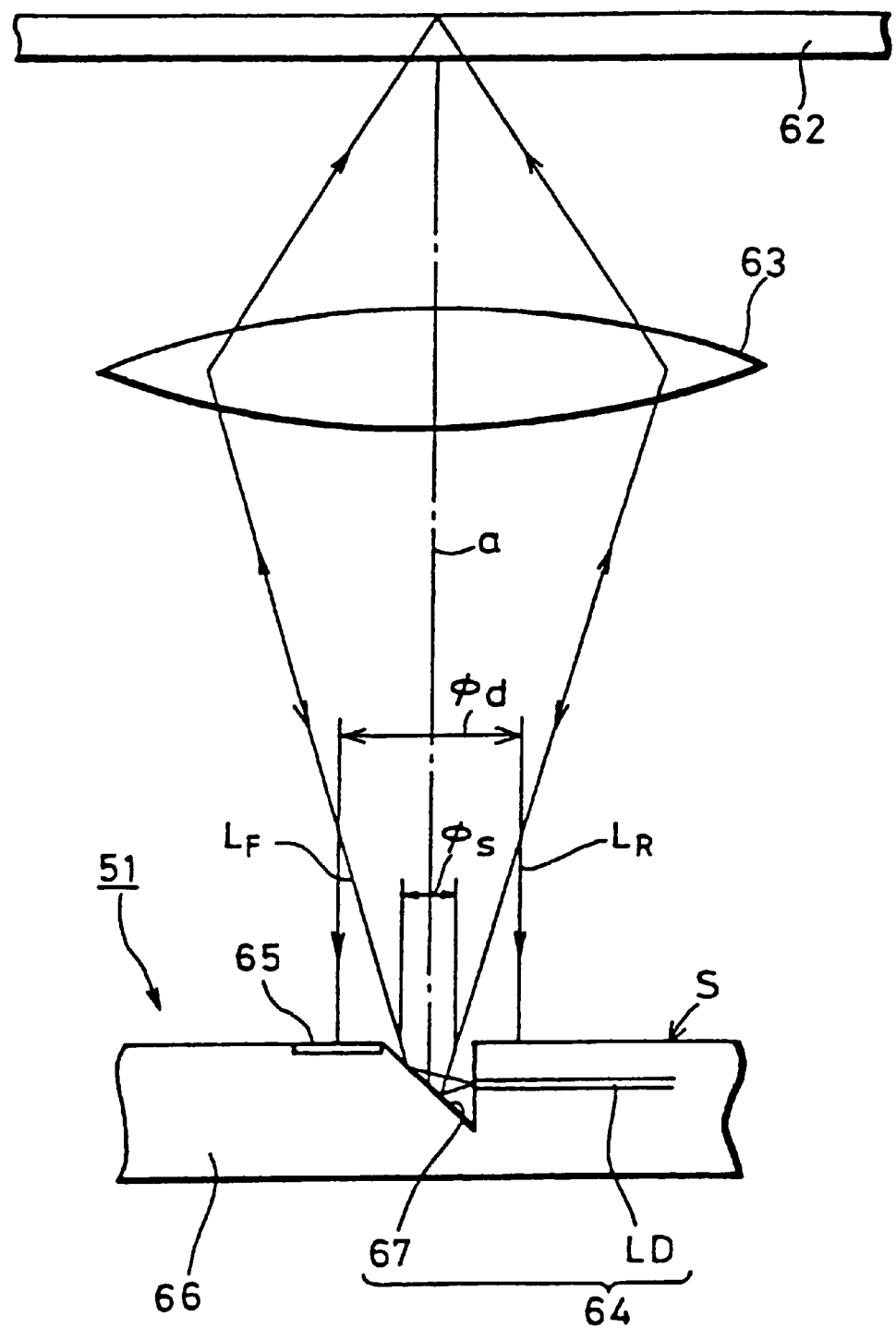
FIG. 10 is a schematic diagram showing an arrangement of a light-coupled device according to the present invention.

In FIG. 10, reference numeral-51 denotes a light-coupled device, 62 an irradiated portion and 63 a converging means, i.e., condenser optical lens.

The light-coupled device 51 includes a common semiconductor substrate 66 on which a light-emitting portion 64 and a light-receiving portion 65 are integrally formed. Light $L_F$ emitted from the light-emitting portion 64 is irradiated on the irradiated portion 62. Returned light $L_R$ from the irradiated portion 62 is converged by the converging means 63 and received by the light-receiving portion 65 located at a confocal position (strictly speaking, located near the confocal position) of the converging means 63. Light from the light-emitting portion 64 is passed through coaxial light paths and is received by the light-receiving portion 65 as shown by an optical axis of a one-dot chain line a in FIG. 10 before and after light emitted from the light-emitting portion 64 is reflected on the irradiated portion 62.

Figure 11:
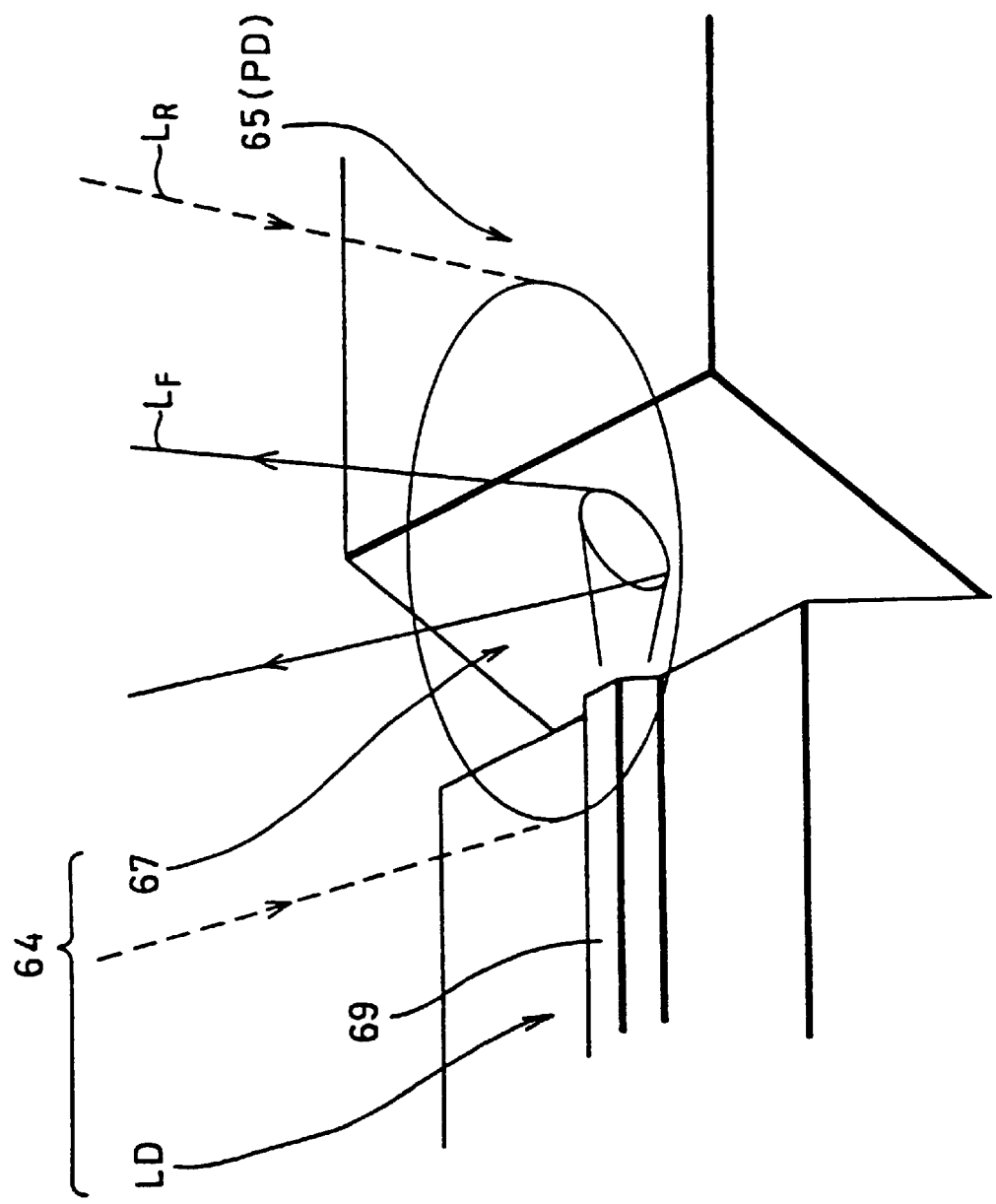
FIG. 11 is a perspective view illustrating a main portion of the light-coupled device shown in FIG. 10 in an enlarged scale.

As FIG. 11 shows in an enlarged scale, in the light-coupled device 51, the light-emitting portion 64 is composed of a semiconductor laser LD (reference numeral 69 denotes its stripe electrode) having a horizontal resonator and a reflector 67. The light-receiving portion 65 is composed of a photodiode PD. The semiconductor laser LD reflects the emitted light $L_F$ by the reflector 67 so that the optical axis the light $L_F$ is agreed with the light path through which the light $L_F$ travels toward the irradiated portion 62.

The reflected-back light $L_R$ traveling toward the light-receiving portion 65 is converged near a light diffraction limit (i.e., diffraction limit of lens). The light-receiving portion 65 is located such that at least a part of the light-receiving surface is placed within this light diffraction limit, i.e., at the position wherein a distance between light emitted from the light-emitting portion 64 intersecting the light-receiving surface arrangement reference plane S and the optical axis falls within 1.22λ/NA where λ is the wavelength of light emitted from the light-emitting portion 64 and NA is the numerical aperture of the converging means 63.

Figure 12:
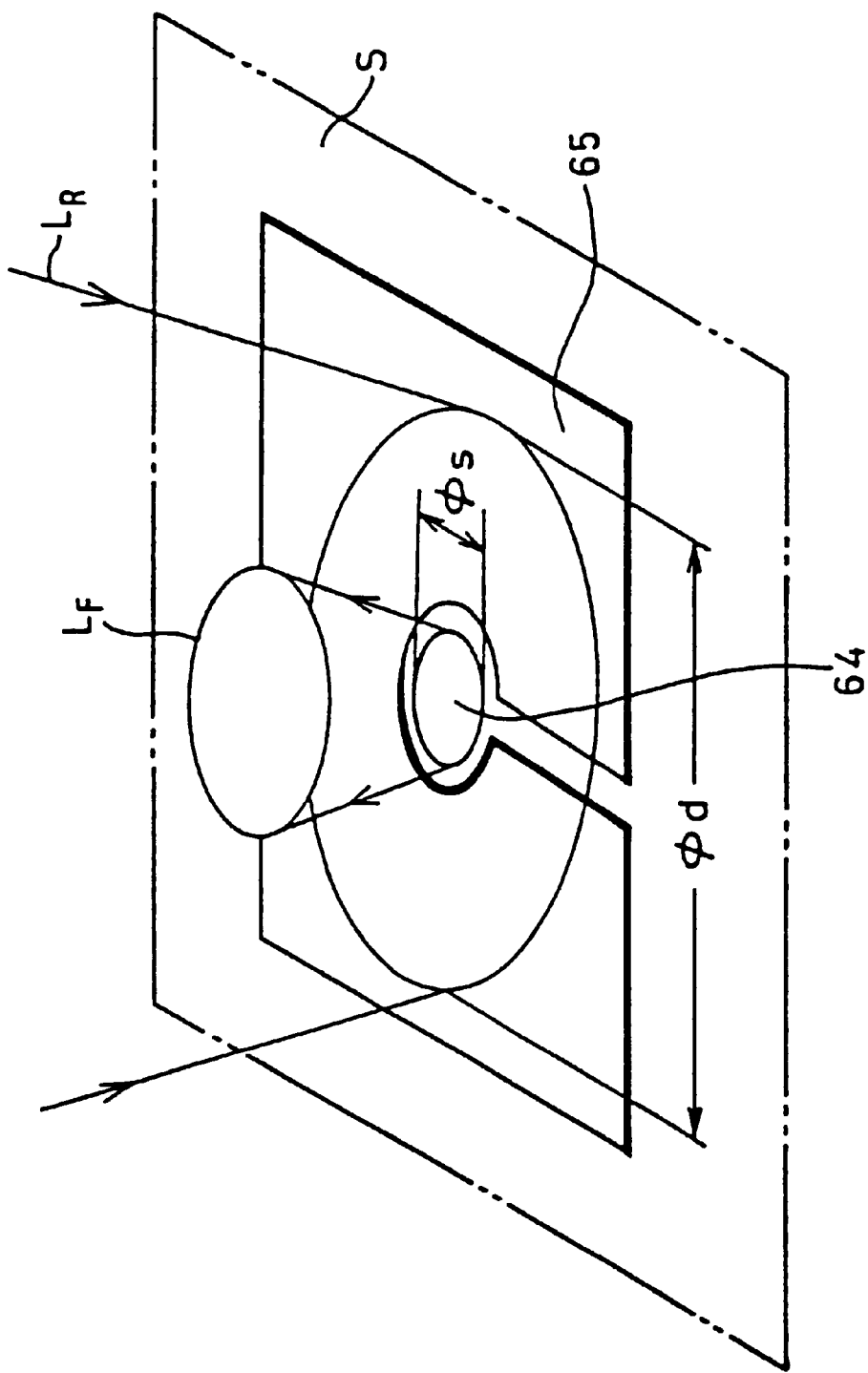
FIG. 12 is a perspective view used to explain the light-coupled device according to the present invention.

As shown in FIGS. 11 and 12, a diameter $\phi_s$ of the light $L_F$ emitted from the light-emitting portion 64 at the light-receiving surface arrangement reference plane S of the light-receiving portion 65 is made smaller than a diameter $\phi_d$ of the light diffraction limit. An effective light-receiving surface of the light-receiving portion 65 is located outside the diameter $\phi_s$ of the light $L_F$. If a semiconductor laser is used as a light source of the light-emitting portion 64, then the diameter $\phi_s$ of the light $L_F$ emitted from the light-emitting portion 64 can be reduced to about 1 to 2 μm. If on the other hand the numerical aperture NA of the converging means 63 is selected in a range of from 0.09 to 0.1 on the side of the light-coupled device 51 and the wavelength λ of the light $L_F$ emitted from the light-emitting portion 63 is about 780 nm, the diffraction limit, i.e., $\phi_d$ falls into a range of 1.22λ/NA≈10 μm.

Laser beam emitted from the semiconductor laser LD of the light-emitting portion 64 is reflected by the reflector 67 in substantially the vertical direction and irradiated on the irradiated portion (e.g., optical disk) 62 through the converging means 63. When laser beam is properly focused on the irradiated portion 62, returned light $L_R$ reflected on the irradiated portion 62, i.e., returned light $L_R$ with recorded information reflected on the irradiated portion 62 is returned through the same light path, converged again by the converging means 63 and introduced into the photodiode PD of the light-receiving portion 65 located near the confocal position. The returned light $L_R$ is received and detected. Specifically, the returned light $L_R$ is converted into an electrical signal (e.g., reproduced signal) and then output.

Figure 13A:
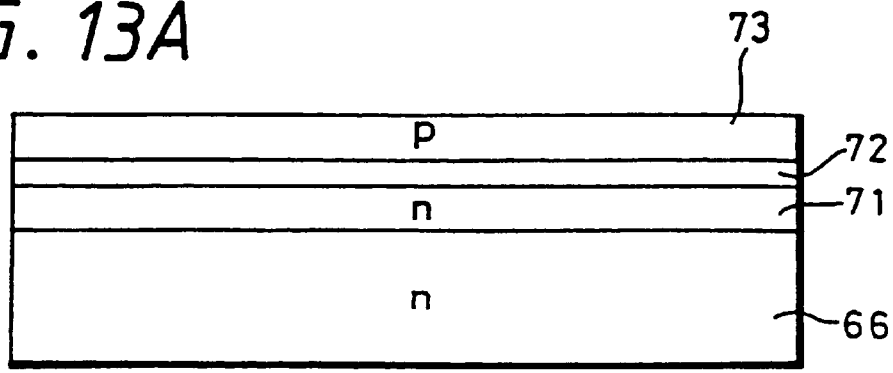
FIGS. 13A through 13F are manufacturing process diagrams showing a representative manufacturing method of a light-coupled device.

A representative example of a method of manufacturing the light-coupled device 51 will be described with reference to FIGS. 13A through 13F. In this example, the light-coupled device 51 is manufactured by selective MOCVD (metal organic chemical vapor deposition). As shown in FIG. 13A, semiconductor layers composing a semiconductor laser are epitaxially grown on a substrate 66 made of a first conductivity type, e.g., n-type GaAs substrate whose major surface is (100) crystal plane. Specifically, a laminated semiconductor layer wherein a first cladding layer 71 formed of an AlGaAs layer of the same conductivity type as that of the substrate 66, an active layer 72 formed of a GaAs layer and a second cladding layer 73 formed of a second conductivity type, which is different from the conductivity of the first cladding layer 71, e.g., p-type AlGaAs layer are epitaxially grown by a proper method such as MOCVD, in that order, is formed on the substrate 66.

Figure 13B:
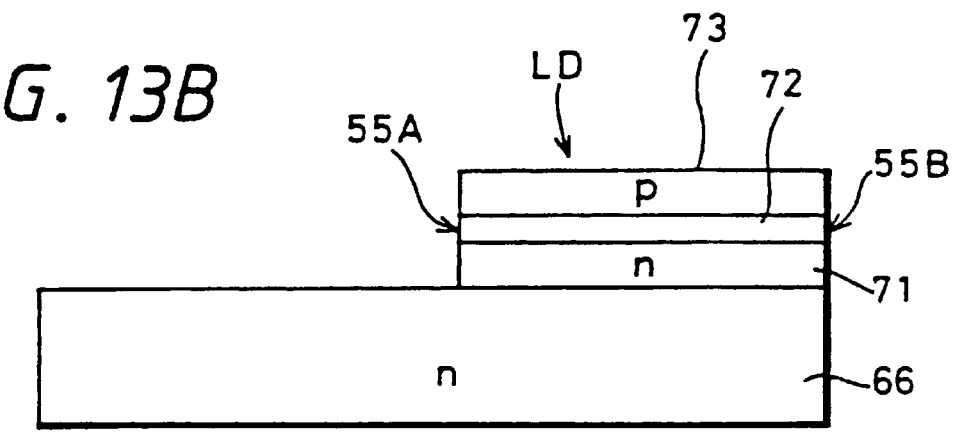

As shown in FIG. 13B, the semiconductor layers 73, 72 and 71 thus epitaxially grown are etched at their portions wherein a reflector is finally formed by a proper method such as RIE (reactive ion etching) such that the semiconductor layers 73, 72, 71 are partly left as a semiconductor laser LD. Two end faces of the semiconductor layer 73, 72, 71 formed by etching are used as resonator end faces 55A and 55B. A horizontal resonator of the semiconductor laser LD is formed between the two resonator end faces 55A and 55B. Although not shown, current blocking regions are formed so as to sandwich the region wherein the horizontal resonator of the semiconductor laser LD is finally formed by implanting impurities.

Figure 13C:
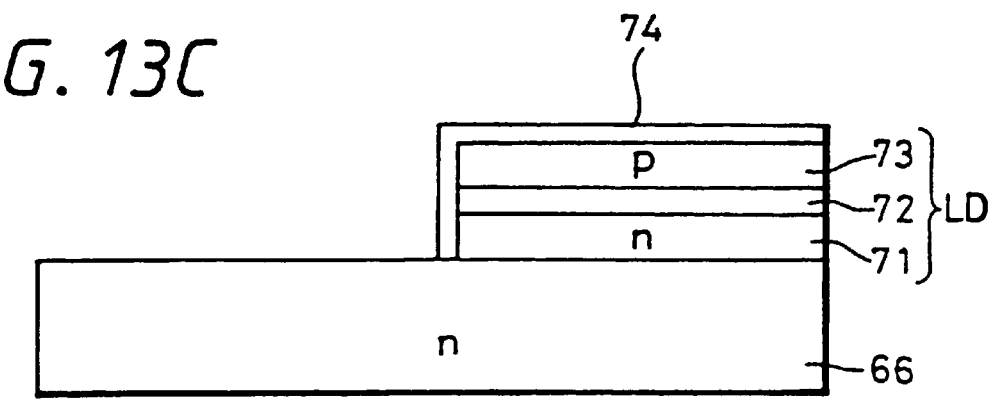

As shown in FIG. 13C, a mask layer 74, e.g., $SiO_2$ or SiN insulating layer is deposited on the integrated semiconductor layer left on the substrate so as to cover the laminated semiconductor layer, i.e., the portion wherein the semiconductor laser LD is formed by selective MOCVD.

Figure 13D:
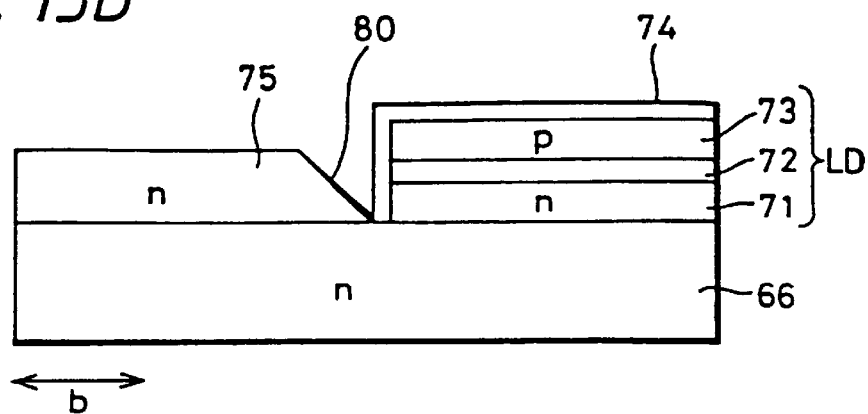

As shown in FIG. 13D, a first semiconductor layer 75 formed of a first conductivity type, e.g., n-type GaAs layer is formed on the substrate 66 at its portion, which is not covered with the mask layer 74, by selective MOCVD.

Figure 13E:
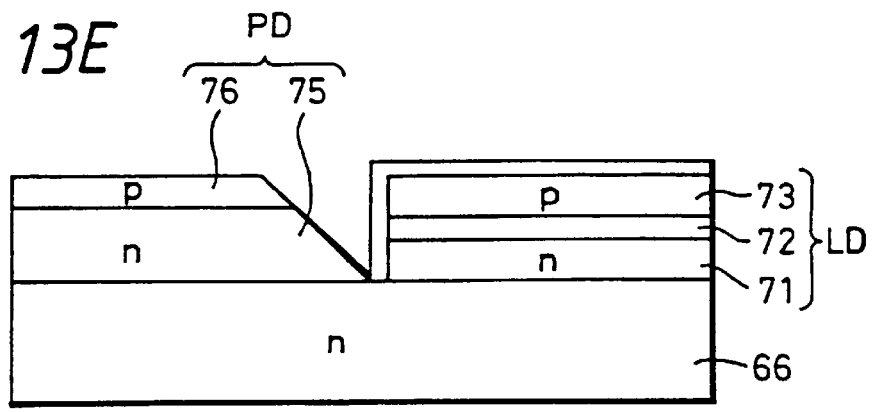

Subsequently, as shown in FIG. 13E, a second semiconductor layer 76 formed of a second conductivity type, e.g., p-type GaAs layer is formed on the first semiconductor layer 75 by selective MOCVD. The first and second semiconductor layers 75 and 76 constitute a photodiode PD.

Figure 13F:
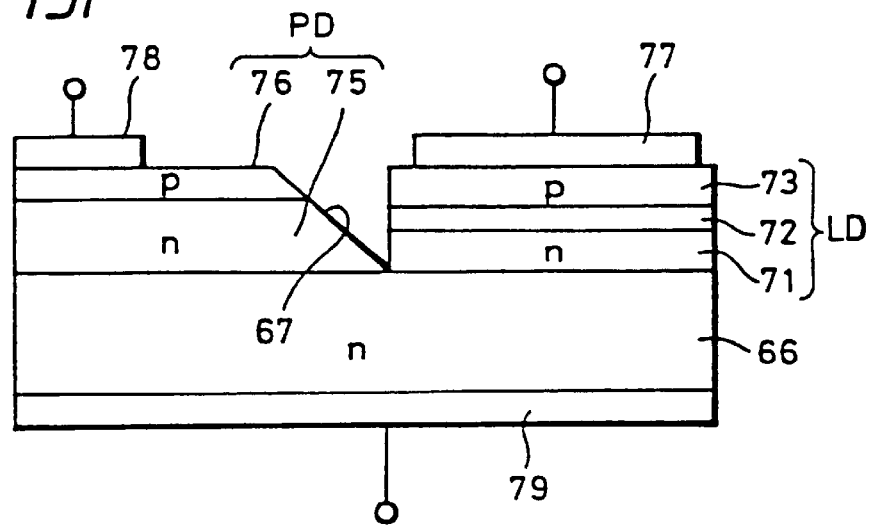

Then, as shown in FIG. 13F, the mask layer 74 is removed by etching. Electrodes 77 and 78 of the semiconductor laser LD and the photodiode PD are deposited on the semiconductor laser LD and a part of the second semiconductor layer 76 to make an ohmic contact. A common electrode 79 is deposited on the back surface of the substrate 66 to make an ohmic contact.

The semiconductor layer epitaxially grown on the substrate 66 by selective MOCVD, in this example, the first semiconductor layer 75 has a plane 80 opposing the resonator end face 55A as shown in FIG. 13D. This plane 80 becomes a specified crystal plane. When a resonator length direction of the horizontal resonator of the semiconductor laser formed between the semiconductor laser end faces 55A and 55B, i.e., direction shown by an arrow b is set to [011]

crystal axis direction, the opposing surface 80 is produced as a {111}A inclined plane. When the direction b is set to [0–11] crystal axis direction, the opposing plane 80 is produced as a {111}B inclined plane. In both cases, an angle formed between the opposing plane 80 and the plate surface of the substrate 66 becomes 54.7°. When the direction b is set to the [100] crystal axis direction, the opposing plane 80 is produced as a {110} inclined plane and forms 45° relative to the plate surface of the substrate 66. The opposing plane 80 is formed as the inclined plane with satisfactory morphology of atomic surface.

Therefore, as shown in FIG. 13F, the inclined plane 80 based on the specified crystal plane can be used as a reflector for reflecting light $L_F$ emitted from the horizontal resonator end face of the semiconductor laser LD so that the reflected light $L_F$ travels in a predetermined direction. The reflector 67 is formed of the crystal plane and is therefore satisfactorily polished and smooth as a mirror. Furthermore, the inclination angle of the reflector 67 can be set accurately.

According to this embodiment, as shown in FIGS. 8A and 8B, the semiconductor light-emitting device package 54 is composed of the light-coupled device 51 serving as the semiconductor light-emitting device, the package window portion 32 formed of the heat sink made of the transparent material passing the wavelength of light (and returned light) output from the semiconductor laser LD of the light-coupled device 51 and the resin mold assembly 33 for sealing the light-coupled device 51. The package window portion 32 can be made of a material similar to that which makes the semiconductor light-emitting device package 45 shown in FIGS. 5A and 5B.

According to this embodiment, in particular, the predetermined electrode pattern 41 is formed on the package window portion 32 at its surface on which the light-coupled device 51 is mounted. The electrode pad 42 is formed on the package window portion 32 at its surface opposite to the surface on which the predetermined electrode pattern 41 is mounted, i.e., on the front surface side of the package window portion 32. An optical element such as a hologram or grating, e.g., hologram 52 is fabricated into the package window portion 32.

The light-coupled device 51, i.e., the surface of the horizontal resonator on the semiconductor laser LD side is bonded to the package window portion 32 so as to face the interconnection pattern 41 of the package window portion 32 through solder layers 43 [43A, 43B] by flip-chip bonding. Then, the resin mold assembly 33 is formed from the back surface side of the light-coupled device 51, thereby the semiconductor light-emitting device package 54 being formed. The hologram 52 is formed on the package window portion 32 at its position corresponding to the position at which light from the semiconductor laser lD is passed through the package window portion 32.

The light-receiving portion is located at a confocal position to which 0th-order light in returned light is reached and at positions to which +1-order light and −1-order light are reached, respectively. As shown in FIG. 8B, this semiconductor light-emitting device package 54 is mounted on the assembly mount substrate 46 through the electrode pad 42 such that the front surface side of the package window portion 32 faces to the downward direction.

The semiconductor light-emitting device package 54 can be given many functions by fabricating optical elements such as the hologram 52 or the grating into the package window portion 32 serving as the heat sink. The semiconductor light-emitting device package 54 can achieve action and effects similar to those of the semiconductor light-emitting device package 45 shown in FIGS. 5A and 5B.

An example of a method of manufacturing the semiconductor light-emitting device package 54 will be described with reference to FIGS. 14A through 14F.

Figure 14A:
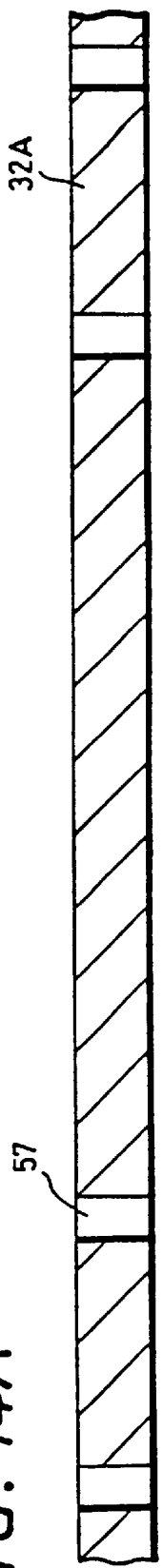

Initially, as shown in FIG. 14A, a transparent substrate 32A for forming the package window portion 32 serving as the heat sink is prepared and a through-hole 54 for forming an electrode pad is formed at every region which forms each package window portion.

Figure 14B:
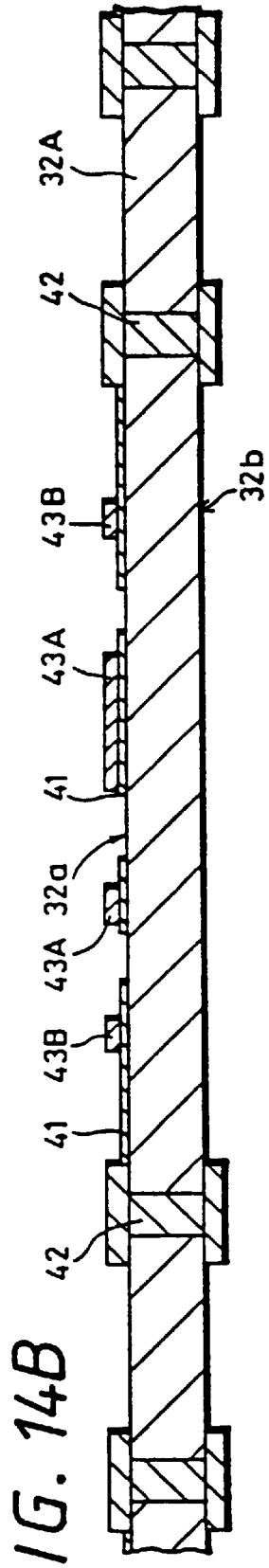

As shown in FIG. 14B, interconnection patterns 41 are formed on the transparent substrate 32 on its surface 32*a* corresponding to the respective regions. The electrode pad 42 is faced to the other surface 32*b* of the transparent substrate 32A through the through-hole 57 so as to be connected to the interconnection pattern 41. Further, the solder layers 43 [43A, 43B] are formed on the interconnection pattern 41.

Figure 14C:
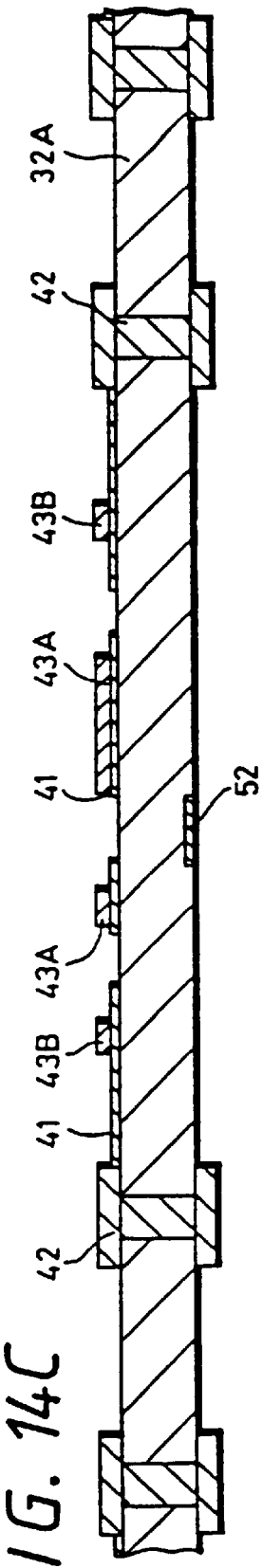

As shown in FIG. 14C, the hologram 52 is formed on the transparent substrate 32A at its predetermined position of the other surface.

Then, as shown in FIG. 14D, the light-coupled device 51 is bonded to and fixed to the interconnection pattern 41 on the transparent substrate 32A by flip-chip bonding. The light-coupled device 51 can be connected at its substrate side to other interconnection pattern 41 by wire bonding.

As shown in FIG. 14E, the resin mold assembly 33 is formed by molding the whole surface so as to cover each light-coupled device 51 with resin.

Thereafter, as shown in FIG. 14F, the resultant semiconductor light-emitting device package is divided by dicing to provide a plurality of packages. Then, the light-coupled device 51 is bonded to the package window portion 32 of the transparent heat sink wherein the hologram 52 is formed. The light-coupled device 51 is covered with the resin mold assembly 33 and thereby the desired semiconductor light-emitting device package 54 can be obtained.

According to the above manufacturing method, the manufacturing process can be simplified extremely. Moreover, the semiconductor light-emitting device package 54 can be simplified in structure and miniaturized considerably. Therefore, the above manufacturing method is suitable for mass-production. This manufacturing method is very advantageous when the semiconductor light-emitting device packages are produced inexpensively and products are miniaturized.

FIGS. 15A through 15E show other example of a manufacturing method using a lead frame.

Initially, as shown in FIG. 15A, the transparent substrate 32A which will form the package window portion 32 serving also as the heat sink is prepared. The predetermined interconnection patterns 41 and the electrode pad 42 are formed on each surface 32*a* of the region portion which forms each package window portion and the solder layers 43 [43A, 43B] are formed on the interconnection pattern 41.

As shown in FIG. 15B, the hologram 52 is formed on the transparent substrate 32A at its other surface 32*b* of each region portion.

As shown in FIG. 15C, the light-coupled device 51 is bonded to and fixed to the interconnection pattern 41 of the transparent substrate 32A by flip-chip bonding.

As shown in FIG. 15D, the transparent substrate 32A is divided by dicing so as to divide each light-coupled device 51.

Thereafter, the package window portion 32 with each light-coupled device 51 fixed thereto is bonded to a lead frame 58 through the electrode pad 42 and molded by resin, thereby the resin mold assembly 33 being formed. In this way, there can be obtained a desired semiconductor light-emitting device package 59 with leads.

According to the above manufacturing method, it is possible to easily manufacture the semiconductor light-emitting device package with leads.

Figure 16:
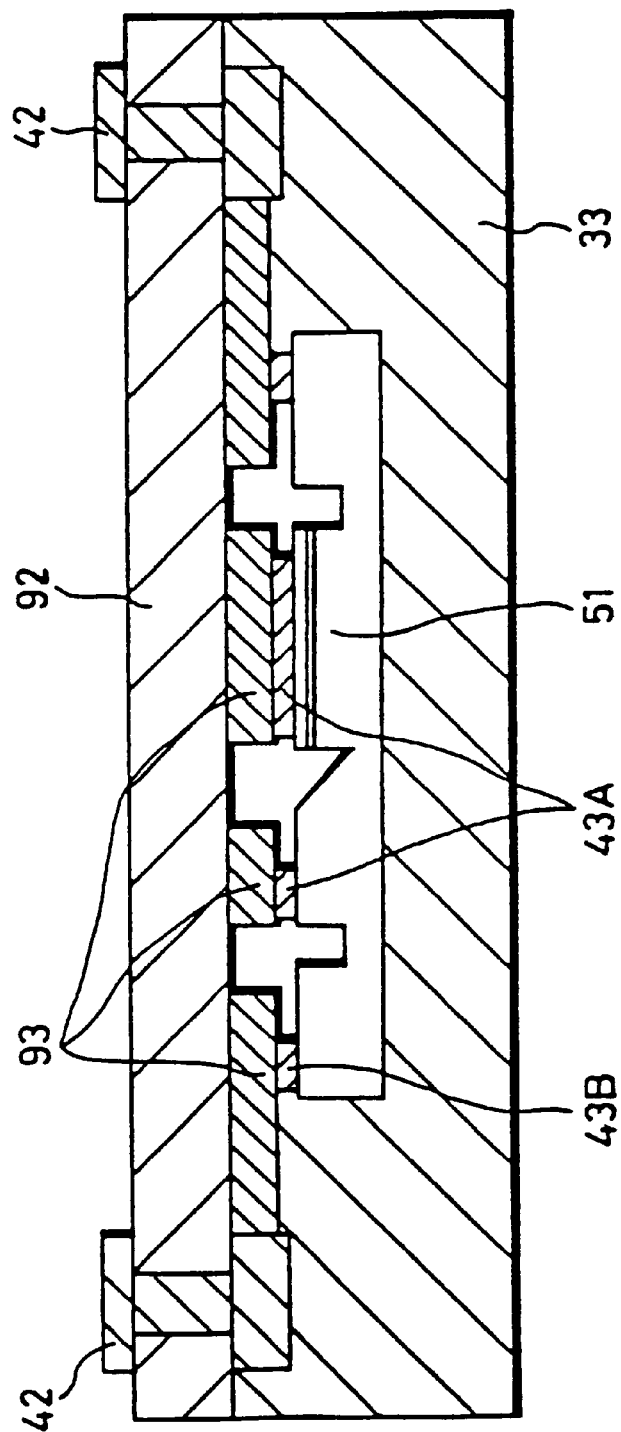
FIG. 16 is a cross-sectional view illustrative of a semiconductor light-emitting device package according to a seventh embodiment of the present invention.

FIG. 16 shows, in cross-sectional form, a semiconductor light-emitting device package according to a seventh embodiment of the present invention.

In this embodiment, a package window portion 92 is formed of a transparent material with a relatively low thermal conductivity, e.g., material such as plastics. A metal thick film heat sink 93 serving also as an interconnection pattern is formed on one surface of the package window portion 92 by a proper method such as plating. The electrode pad 42 that is connected to the metal thick film heat sink 93 is faced to the front surface of the package window portion 92. The light-coupled device 51 is bonded to the interconnection pattern 93 of the metal thick film heat sink through the solder layers 43 [43A, 43B]. Then, the resin mold assembly 33 is formed and thereby a semiconductor light-emitting device package 94 can be fabricated.

Figure 4:
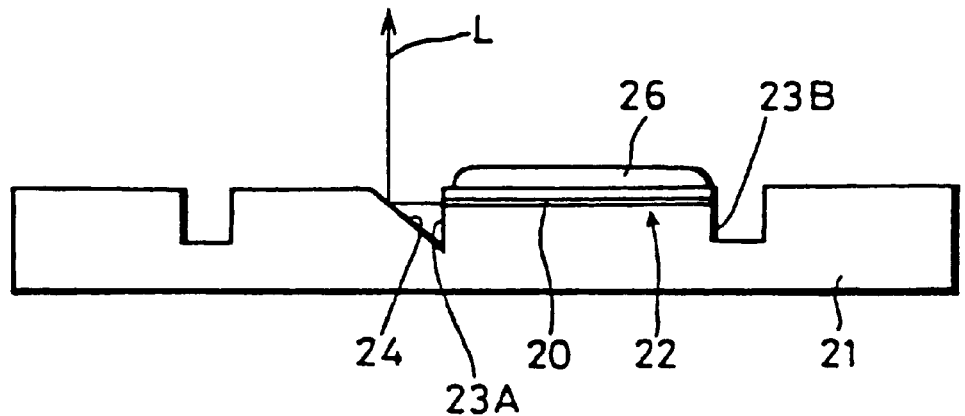
FIG. 4 is a cross-sectional view showing another example of a surface-emission semiconductor light-emitting device.

According to the semiconductor light-emitting device package 94, since the interconnection pattern 93 serving also as the thick film heat sink is formed on the flat plate-shaped package window portion 92, the semiconductor light-emitting device package 94 can be manufactured easily as compared with the surface-emission semiconductor light-emitting device shown in FIG. 4 wherein a metal thick film is formed on the uneven element. Furthermore, since the package window portion 92 can be made of the transparent material (e.g., plastics, etc.) with a low thermal conductivity, the semiconductor light-emitting device package 94 can be made inexpensive.

Figure 17:
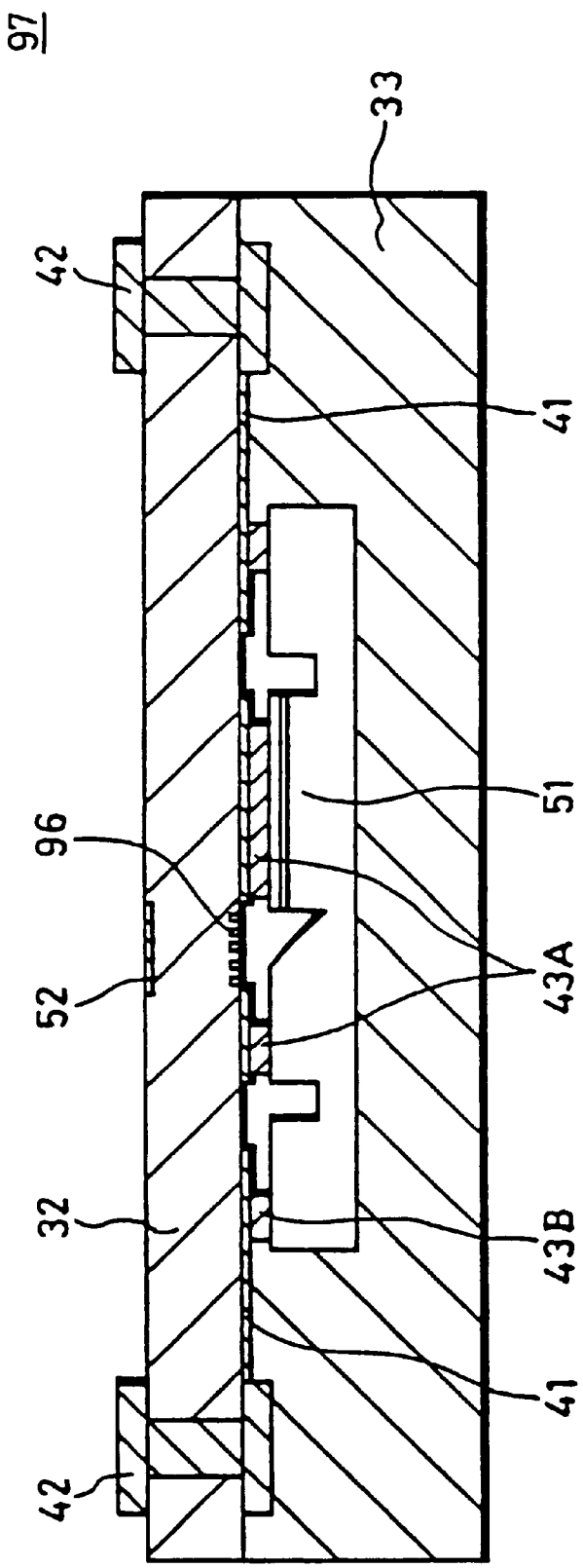
FIG. 17 is a cross-sectional view illustrative of a semiconductor light-emitting device package according to an eighth embodiment of the present invention.

FIG. 17 shows, in cross-sectional form, a semiconductor light-emitting device package according to an eighth embodiment of the present invention.

As shown in FIG. 17, a semiconductor light-emitting device package 97 according to the present invention is composed of the package window portion 32 formed of the transparent heat sink, the light-coupled device 51 and the resin mold assembly 33. Optical elements, i.e., the hologram 52 and a grating 96 are fabricated on both surfaces of the package window portion 32. If necessary, the semiconductor light-emitting device package 97 can be given many functions by fabricating an ordinary lens, a Fresnel lens and a prism on both surfaces of the package window portion 32 in accordance with various purposes. A rest of the arrangement is similar to that of the semiconductor light-emitting device package 49 shown in FIGS. 7A and 7B. Therefore, in FIG. 17, like parts corresponding to those of FIGS. 7A and 7B are marked with the same references and need not be described herein.

Figure 18:
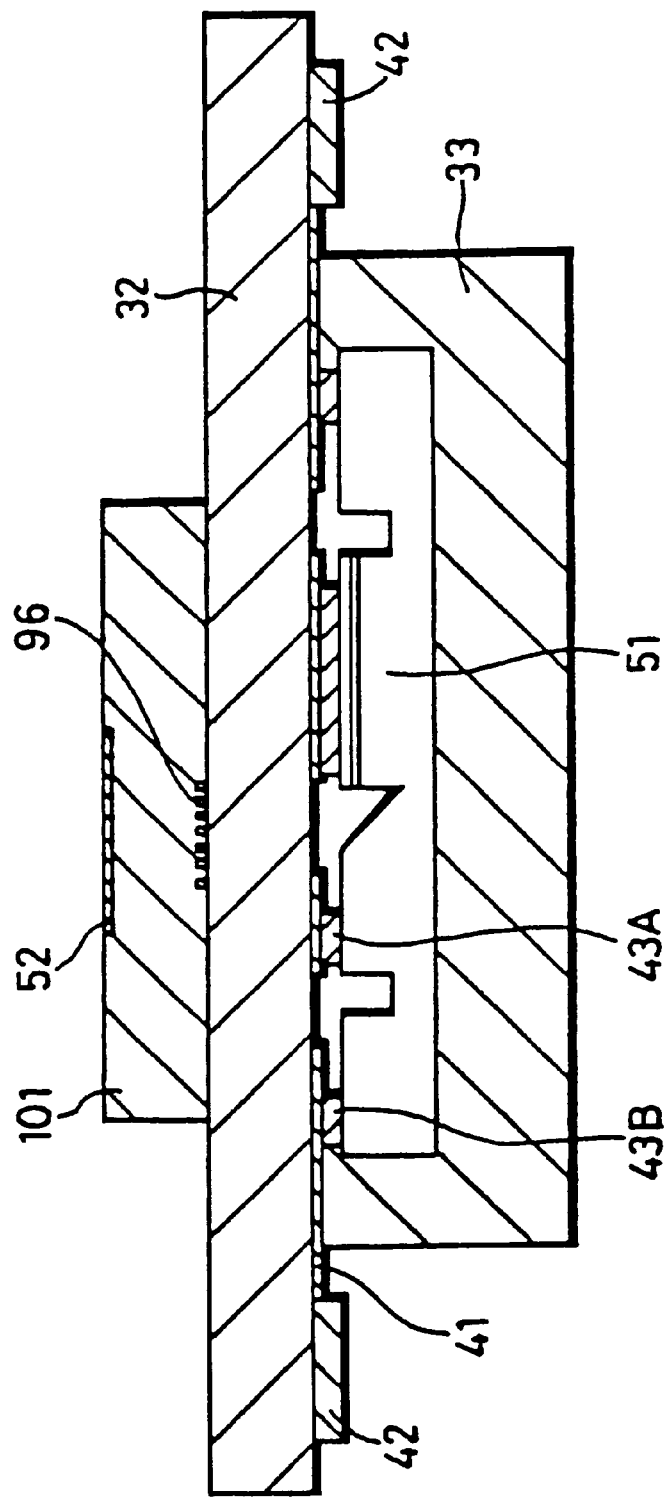
FIG. 18 is a cross-sectional view illustrative of a semiconductor light-emitting device package according to a ninth embodiment of the present invention.

FIG. 18 shows, in cross-sectional form, a semiconductor light-emitting device package according to a ninth embodiment of the present invention. In a semiconductor light-emitting device package 99 according to the present invention, an optical element is not fabricated on the package window portion 32 formed of the transparent heat sink. But instead, as shown in FIG. 18, optical elements, i.e., the hologram 52 and a grating 96 are formed on both surfaces of another transparent plate 101. This transparent plate 101 is bonded to the package window portion 32 at its surface opposite to the surface to which the light-coupled device 51 is bonded.

A rest of the arrangement is similar to that of the semiconductor light-emitting device package 45 shown in FIG. 5A. Therefore, in FIG. 18, elements and parts identical to those of FIG. 5A are marked with the same references and need not be described in detail.

According to the semiconductor light-emitting device package 99, although the number of assemblies is increased due to the addition of another transparent plate 101, the positioning of the hologram 52 and the grating 96 of the optical elements can be carried out after the light-emitting device and the light-receiving device had been mounted, i.e., the light-coupled device 51 had been mounted on the package window portion 32. Accordingly, the semiconductor light-emitting device package 99 is suitably applied to devices which require a high positioning accuracy.

Furthermore, the semiconductor light-emitting device package 99 can be given many functions by fabricating an ordinary lens, a Fresnel lens and a prism into another transparent plate 101 in accordance with various purposes.

Figure 19:
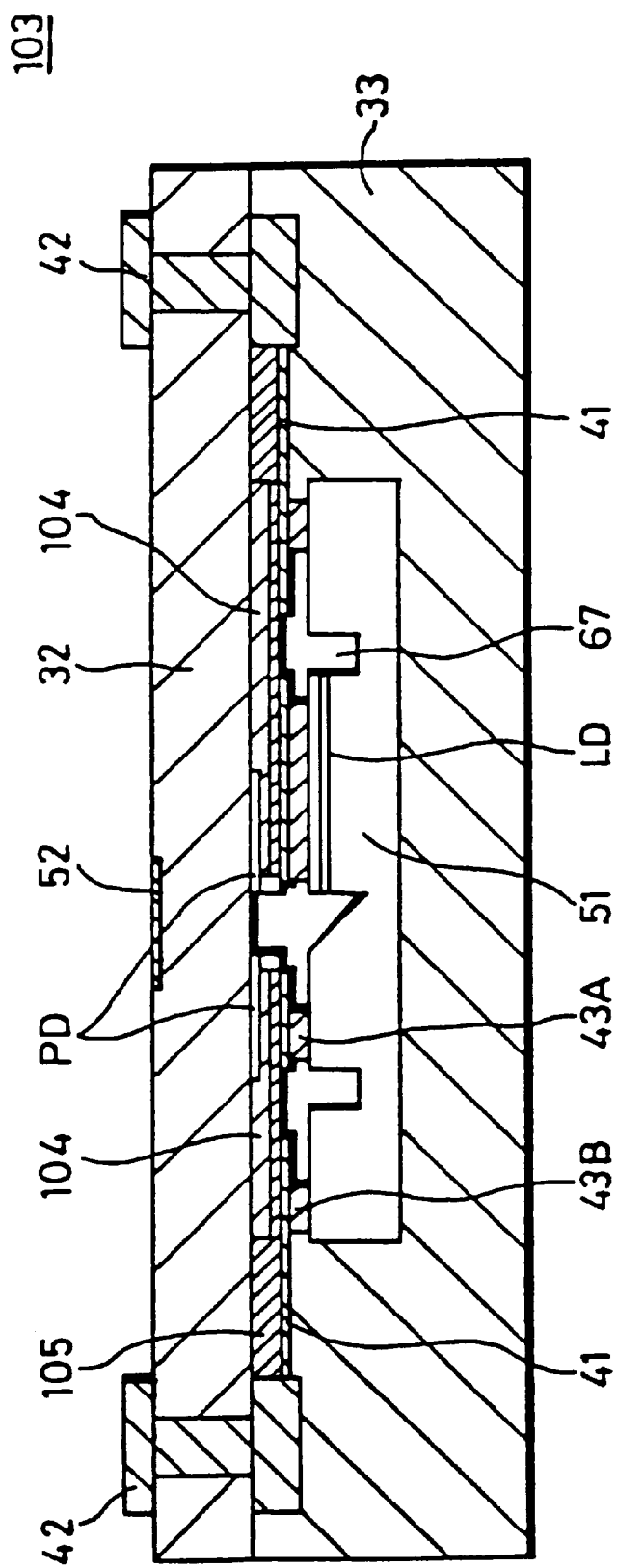
FIG. 19 is a cross-sectional view illustrative of a semiconductor light-emitting device package according to a tenth embodiment of the present invention.

FIG. 19 shows, in cross-sectional form, a semiconductor light-emitting device package according to a tenth embodiment of the present invention. As shown in FIG. 19, in a semiconductor light-emitting device package 103 according to the present invention, a light-receiving device of the light-coupled device, which is the CLC device, i.e., a photodiode PD, is not fabricated is on a semiconductor laser LD side but fabricated on the package window portion 32 side.

Specifically, as shown in FIG. 19, a photodiode PD made of amorphous silicon or polycrystalline silicon by plasma CVD, for example, is formed on the whole surface of the package window portion 32 formed of the transparent heat sink at the position corresponding to a semiconductor laser LD and a reflection surface 67 and an interconnection 104 is formed. An insulating film 105 is adapted to protect the photodiode PD. A predetermined interconnection pattern 41 is formed with the insulating film 105. The optical element, i.e, hologram 52 is formed on the other surface of the package window portion 32. Then, the light-coupled device 51 is bonded to the package window portion 32 through the solder layers 43 [43A, 43B] so as to be connected to the interconnection pattern 41. The resin mold assembly 33 is formed from the back surface of the light-coupled device 51 and thereby the semiconductor light-emitting device package 103 can be fabricated.

In the light-coupled device 51, when the photodiode PD, which is the light-receiving element, is fabricated on the semiconductor laser side, the photodiode PD can be easily fabricated on the reflection surface 67 but the photodiode PD cannot be fabricated on the semiconductor laser LD because the electrodes of the semiconductor laser LD and the photodiode PD cannot be fabricated independently without difficulty. However, according to the semiconductor light-emitting device package 103 shown in FIG. 19, since the photodiode PD is formed on the package window portion 32, the above-mentioned problem can be solved and a light-receiving efficiency can be raised.

Figure 20:
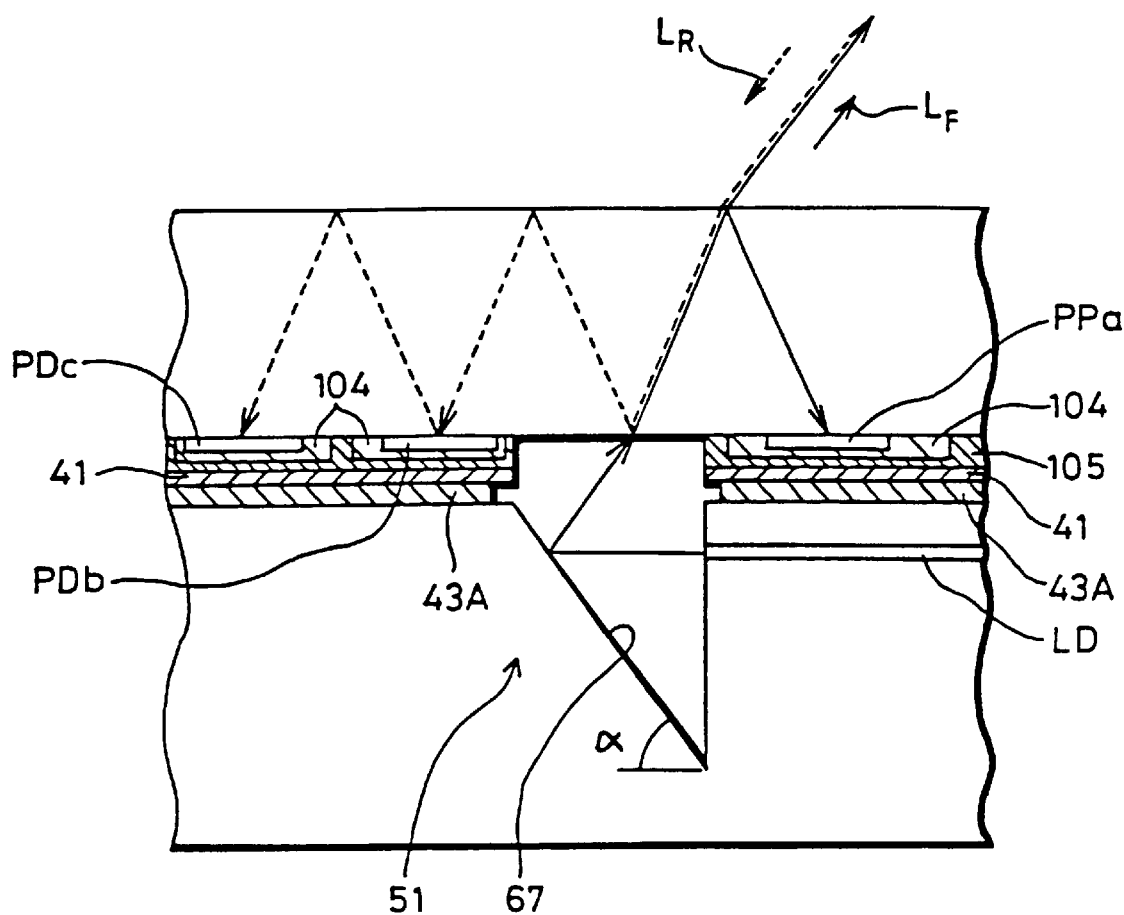
FIG. 20 is a cross-sectional view illustrative of a main portion of a semiconductor light-emitting device package according to an eleventh embodiment of the present invention.

FIG. 20 shows, in cross-sectional form, a semiconductor light-emitting device package according to an eleventh embodiment of the present invention. A semiconductor light-emitting device package 107 shown in FIG. 20 is different from the semiconductor light-emitting device package 103 shown in FIG. 19 only in that the angle a of the reflection surface 67 of the light-coupled device 51 is selected to be 45° or larger, a part of light $L_F$ is reflected on the surface of the package window portion 32 so that a part of light $L_F$ is received by a photodiode $PD_c$ on the semiconductor laser LD side in the photodiodes PD [$PD_a$, $PD_b$, $PD_c$] and that returned light $L_R$ is reflected within the package window 32 so that returned light $L_R$ is received by the focusing-servo signal detection or tracking servo signal detection photodiodes $PD_a$ and $PD_b$ on the reflection surface 67 side.

Although FIG. 20 shows only a main portion of the semiconductor light-emitting device package 107, a rest of the arrangement is similar to that of the semiconductor light-emitting device package 103 shown in FIG. 19 and therefore need not be described.

In this embodiment, while returned light $L_R$ is reflected within the package window portion 32 as described above, the present invention is not limited thereto and another transparent plate can be disposed on the package window portion 32 and returned light $L_R$ can be reflected by this transparent plate.

Figure 21:
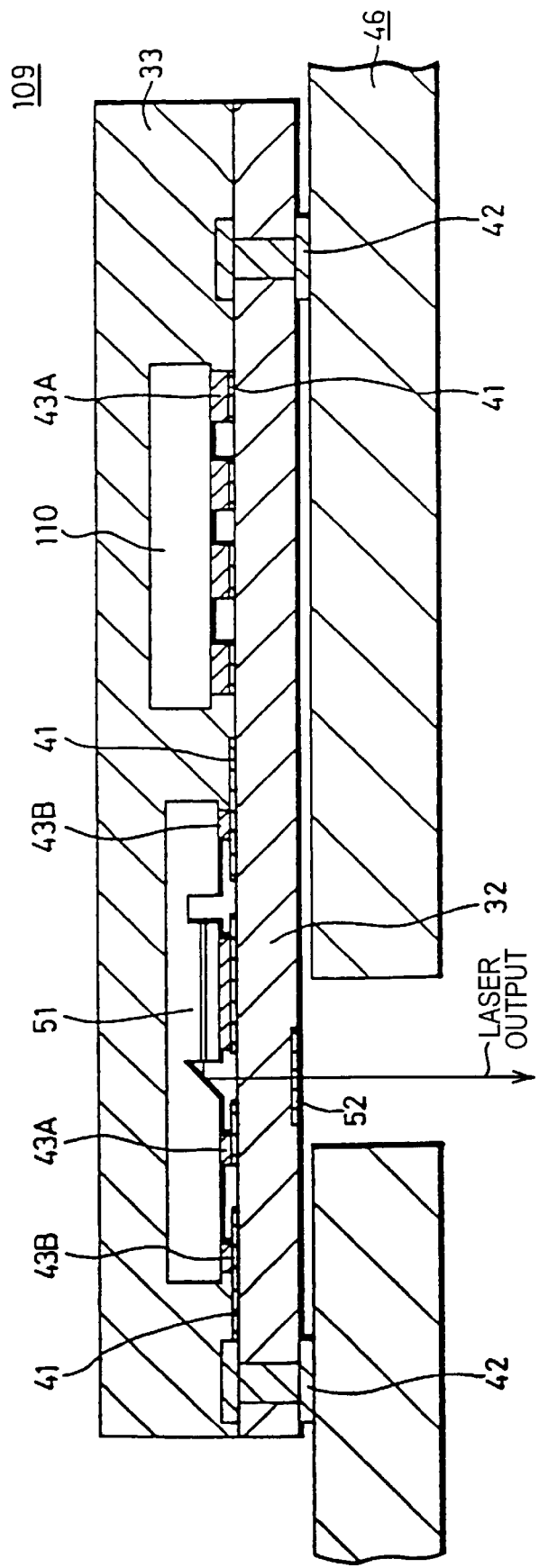
FIG. 21 is a cross-sectional view illustrative of a manner in which a semiconductor light-emitting device package according to a twelfth embodiment is mounted on an assembly mount substrate.

FIG. 21 shows, in cross-sectional form, a semiconductor light-emitting device package according to a twelfth embodiment of the present invention.

As shown in FIG. 21 a semiconductor light-emitting device package 109 according to the present invention is composed of the package window portion 32 formed of the transparent heat sink, a light-coupled device 51 of CLC device, a calculation IC 110, the light-coupled device 51 and the calculation IC 101 being integrated on the window package portion 32 in a hybrid fashion and the resin mold assembly 33 molded on the whole surface from the back surface of the light-coupled device 51.

In FIG. 21, like elements and parts corresponding to those of the semiconductor light-emitting device package 54 shown in FIGS. 8A and 8B are marked with the same references and therefore need not be described in detail.

In the semiconductor light-emitting device package 109, since the back surface is wholly covered with the resin mold assembly 33, the calculation IC 110 can be optically confined completely so that the semiconductor light-emitting device can be prevented from being operated erroneously by stray light generated from the light-coupled device 51.

The above semiconductor light-emitting device packages 94, 97, 99, 103, 107, 109 can achieve similar action and effects to those of the semiconductor light-emitting device package 45 shown in FIGS. 5A and 5B.

The embodiments of the semiconductor light-emitting device packages using the light-coupled device 51 of the CLC device can be applied to an optical pickup of an optical disk drive of a so-called compact disc (CD) player and a magneto-optical disk player.

On the other hand, the present invention can be advantageously applied to a vertical resonator surface-emission laser.

Figure 22:
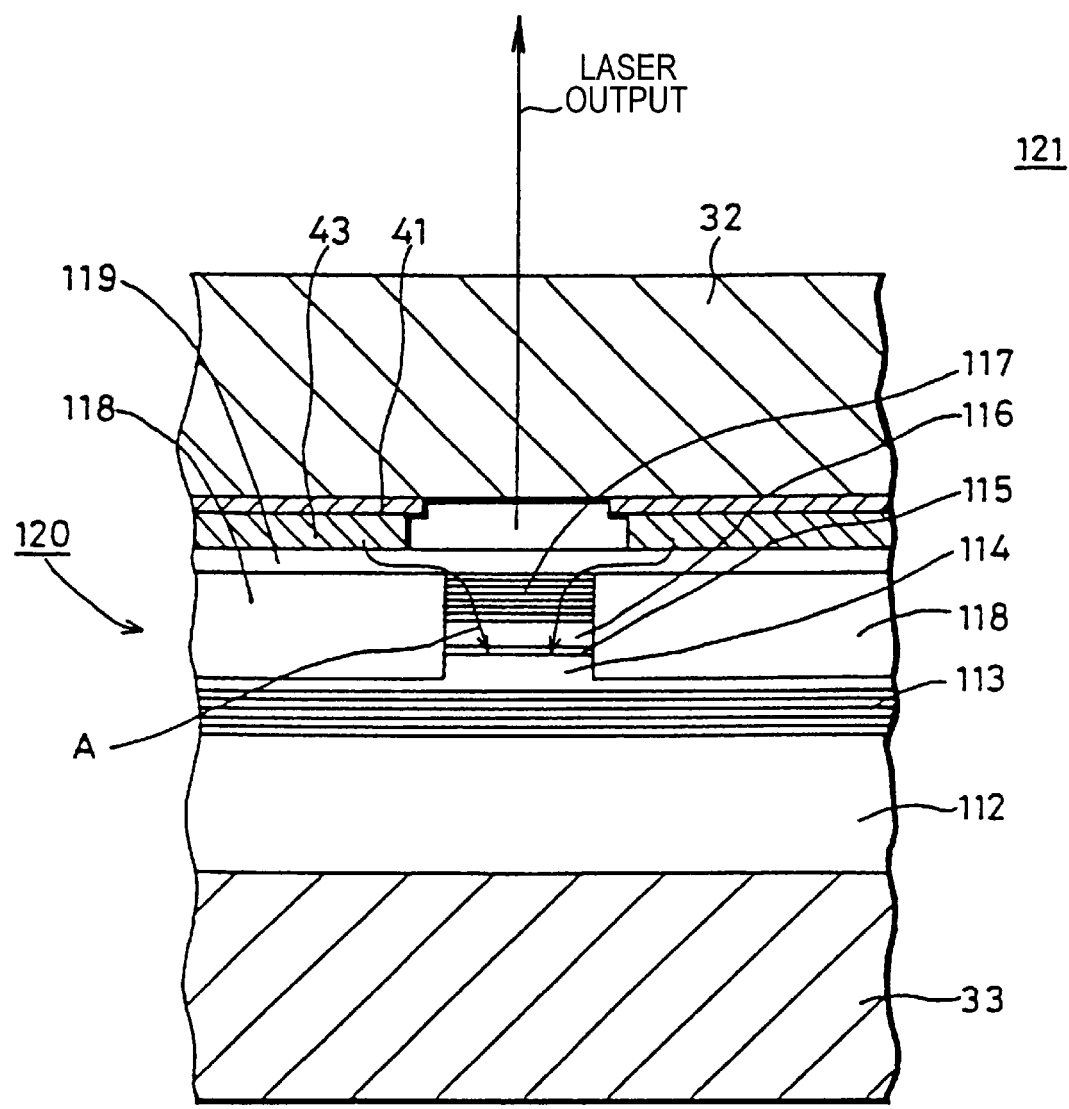
FIG. 22 is a cross-sectional view illustrative of a main portion of a package according to a thirteenth embodiment of the present invention obtained when the present invention is applied to a vertical resonator surface-emission device.

FIG. 22 shows, in cross-sectional form, a semiconductor light-emitting device package according to a thirteenth embodiment of the present invention wherein the present invention is applied to a vertical resonator surface-emission laser.

According to this embodiment, as shown in FIG. 22, a first reflection film (n type) 113 formed of a semiconductor multilayer film with a high reflectivity or dielectric multilayer film is formed on a n-type substrate 112, for example. A first cladding layer 114, an active layer 115, a second cladding layer 116 and a second reflection film (p-type) similar to the first reflection film 113 are formed on the first reflection film 113. Current-blocking layers 118 are formed at both sides of the first reflection film 113. A capping layer 119 is formed on the current-blocking layers 118. An exit end face of a vertical resonator surface-emission light-emitting laser 120 which is energized to emit light in the vertical direction by injecting a current A is bonded to the package window portion 32 formed of the transparent heat sink at its surface in which the interconnection 41 is formed through the solder layer 43 and covered with the resin mold assembly 33 from the back surface, thereby a semiconductor light-emitting device package 121 being formed.

According to the semiconductor light-emitting device package 121, light is passed through and emitted from the package window portion 32. Also, this package window portion 32 is served as the heat sink to satisfactorily radiate heat generated from the surface-emission laser.

In general, since the vertical resonator surface-emission laser includes the semiconductor multilayer film with a high reflectivity and the dielectric multilayer film, the current A is difficult to be injected and a device resistance increases with the result that the vertical resonator surface-emission laser generates heat very much to badly affect efficiency and performance of the device.

Figure 23:
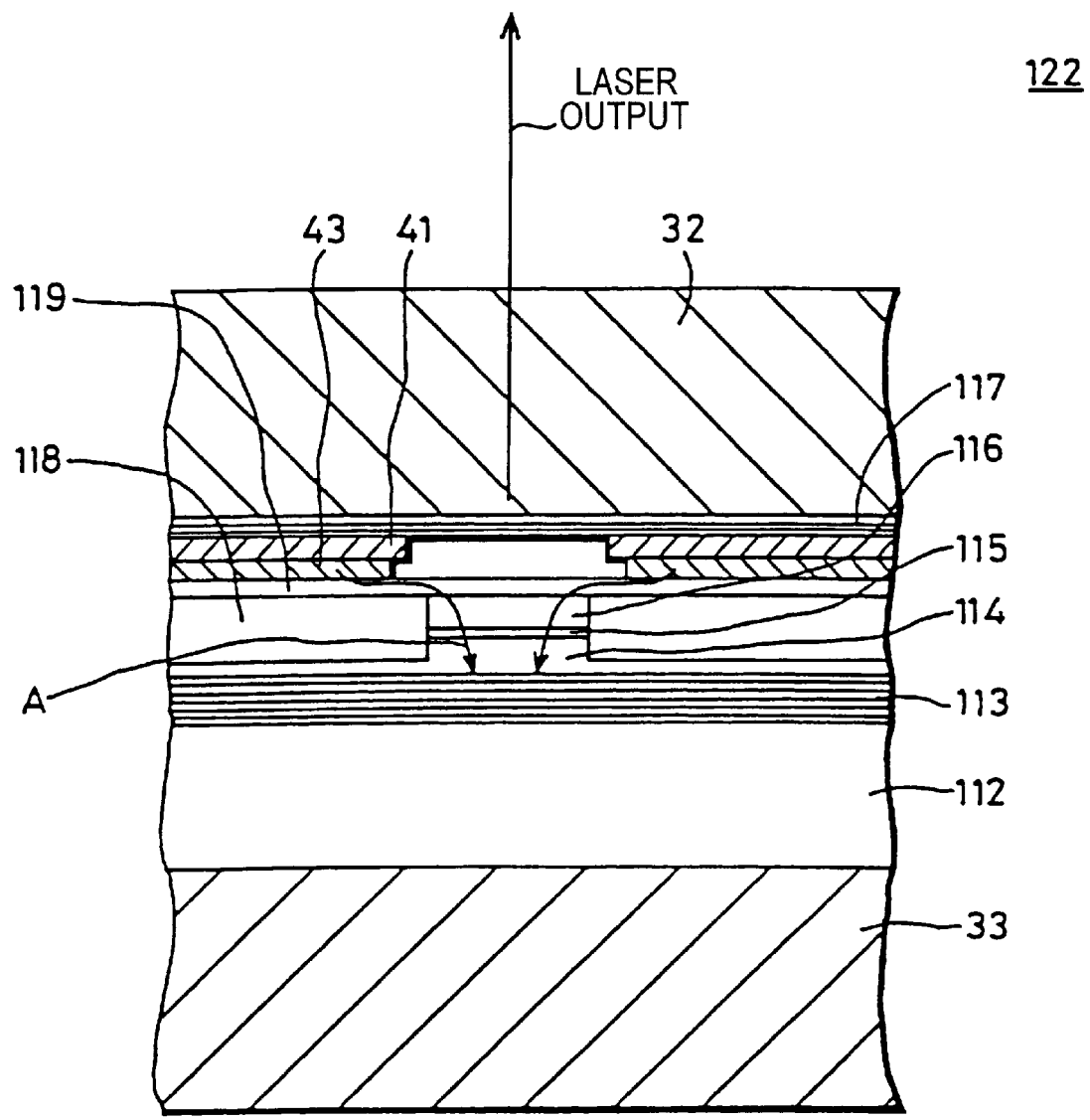
FIG. 23 is a cross-sectional view illustrative of an optical device package according to a fourteenth embodiment of the present invention obtained when the present invention is applied to a vertical resonator surface-emission device.

FIG. 23 shows, in cross-sectional form, a semiconductor light-emitting device package according to a fourteenth embodiment of the present invention wherein the present invention is applied to the vertical resonator surface-emission laser.

In a semiconductor light-emitting device package 122 according to the present invention, a second reflection film 117 on the front side for emitting light is formed on the package window portion 32 side. A rest of the arrangement of the semiconductor light-emitting device 122 package shown in FIG. 23 is the same as that of the semiconductor light-emitting device package 121 shown in FIG. 22. Therefore, in FIG. 23, elements and parts identical to those of FIG. 22 are marked with the same references and need not be described.

In the semiconductor light-emitting device package 122 according to the present invention, although a microwave cavity structure is difficult to be made, if a semiconductor resonator with a long resonator length is used as a reflection film of p layer, then a problem caused when the current is injected into the semiconductor light-emitting device can be alleviated considerably.

A manufacturing process and a structure of light-coupled device 51 will be described more fully with reference to FIGS. 9A, 9B and FIG. 19.

Figure 9A:
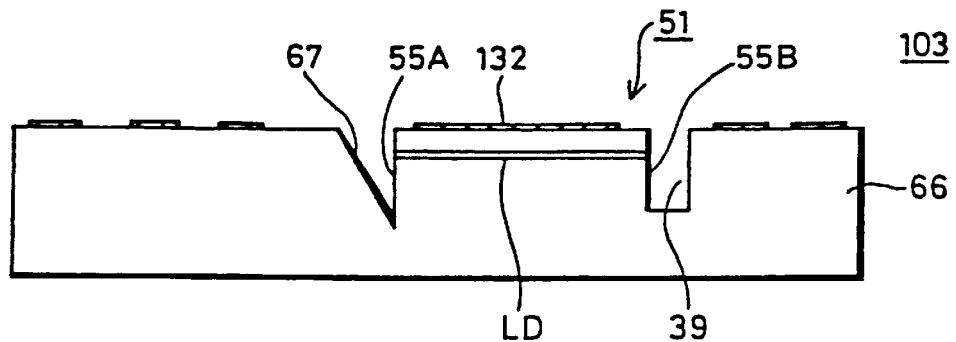
FIG. 9A is a cross-sectional view illustrative of a specific example of a CLC light-coupled device.
Figure 9B:
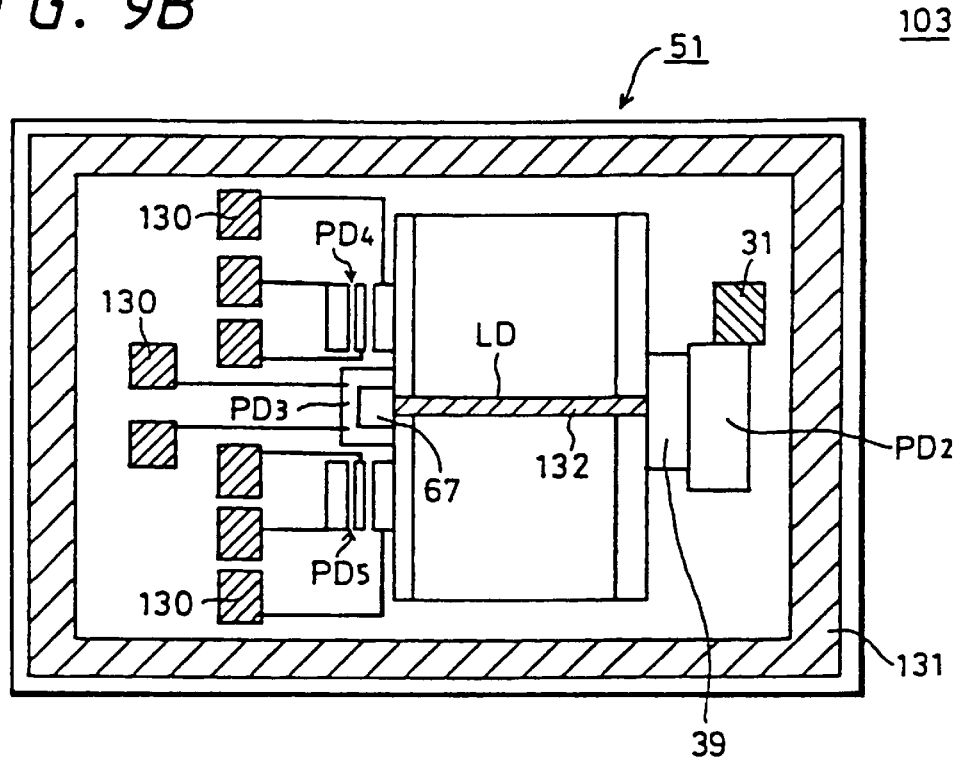
FIG. 9B is a plan view illustrative of the specific example the CLC light-coupled device.

The light-coupled device 51 serving as the CLC device, as shown in FIG. 9A (cross-sectional view) and FIG. 9B (plan view), includes a horizontal resonator semiconductor laser LD wherein a stripe electrode 132 is formed at the center of the semiconductor substrate. The reflection surface 67 is opposed to one resonator end face 55A. A monitoring photodioded $PD_2$ is formed in the area opposing the other resonator end face 55B through the separating groove 39. A tracking-servo photodiode $PD_3$ and focusing-servo signal photodiodes $PD_4$ and $PD_5$ with metal grids which sandwich the tracking-servo signal photodiode $PD_3$ are formed on the area of the reflection surface 67. Contact electrode portions 130 are lead out from the photodiodes $PD_2$, $PD_3$, $PD_4$ and $PD_5$, respectively. A sealing metal layer 131 is formed around the substrate 66.

An external electrode (i.e., electrode pad) of the package 103 is of the type using a through-hole and a single-sided type can be properly used. The external electrode (i.e., electrode pad) and an internal interconnection (i.e., interconnection pattern) are made of Al, for example. The surfaces of the external electrode and the internal interconnection are protected by SiO$_2$ and/or SiN or the like. The sealing metal layer 131 and portions corresponding to the contact electrodes 130 of the photodiodes PD$_2$, PD$_3$, PD$_4$ and PD$_5$ include the solders 43 or Au electrodes formed thereon by patterning and which are connected to the interconnection pattern 41 formed of Al or the like.

In the mount process for mounting the light-coupled device 51 on the package window portion 32, if the solder patterning is used, then the light-coupled device 51 can easily be monitored microscopically, thereby making it possible to obtain a very high positioning accuracy.

Although the mount process for mounting the light-coupled device 51 on the package window portion 32 is an individual process, a so-called batch processing can be carried out in which a number of light-coupled devices 51 are grouped on a single package window portion 32 for processing during the same machine run by soldering. Thus, the number of processes can be lessened.

Au layers can be bonded by ultrasonic soldering.

Since the light-coupled device 51 is wholly sealed by the sealing metal layer, the semiconductor substrate and the package window portion according to the sealing metal structure, the light-coupled device 51 can be fabricated as a highly-reliable device which is difficult to be fluctuated with a temperature.

The light-coupled device 51 and the package window portion 32 are wholly molded in order to prevent the GaAs substrate from being exposed rather than consideration of environmental capabilities. There are known several dipping means. For example, there can be satisfactorily used rough dipping such as epoxy thermosetting resin type coating means or ultraviolet (UV) curing type resin coating means.

Upon dicing, so-called full-cut process in silicon wafer is carried out in order to a whole wafer thickness by a dicer. Therefore, a packaged light-coupled device can be handled similarly to ordinary semiconductor pellets and are easy to handle. That is, the packaged light-coupled device can be automatically mounted on the substrate in the same way as semiconductor chips on an adhesive sheet.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method for manufacturing a plurality of semiconductor light-emitting device packages, comprising the steps of:

providing a transparent heat sink substrate;

forming a plurality of interconnection patterns each for a respective semiconductor light-emitting device on the transparent heat sink substrate;

manufacturing a plurality of light-emitting devices, each light-emitting device comprising a substrate;

bonding each of the light-emitting device substrates to the respective interconnection patterns on the transparent heat sink substrate, the transparent heat sink substrate having a respective package window portion for transmission of light from the respective light-emitting device; and dividing said transparent heat sink substrate by dicing to provide a plurality of said semiconductor light-emitting device packages.

2. The method according to claim 1 including the step of providing said light-emitting device substrate with a reflection surface and a plurality of layers for forming said light-emitting device adjacent said reflection surface, and providing a resonator end face adjacent said reflection surface, and also providing respective separating grooves at both sides of said light-emitting device.

3. The method according to claim 1 including the step of providing a hologram at said package window portion adjacent each light-emitting device on said transparent heat sink substrate at a side opposite where said light-emitting device substrate is bonded.

4. The method according to claim 1 including the step of sealing with a common layer at a surface of said transparent heat sink substrate said plurality of substrates containing said light-emitting devices prior to said dicing.

5. The method according to claim 4 including the step of providing said sealing as a resin mold layer.

6. The method according to claim 1 including the step of providing respective electrode pad portions as part of said interconnection patterns on said transparent heat sink substrate and associated with each light-emitting device so that after dicing said respective pads are provided for each of the light-emitting device packages.

* * * * *